(12) United States Patent
Takayanagi et al.

(10) Patent No.: US 12,512,797 B2
(45) Date of Patent: Dec. 30, 2025

(54) METHOD FOR CONTROLLING HIGH-FREQUENCY POWER SUPPLY DEVICE, AND HIGH-FREQUENCY POWER SUPPLY DEVICE

(71) Applicant: KYOSAN ELECTRIC MFG. CO., LTD., Yokohama (JP)

(72) Inventors: Atsushi Takayanagi, Yokohama (JP); Toshinori Takeuchi, Yokohama (JP); Hirokazu Takada, Yokohama (JP); Soichi Yokoyama, Yokohama (JP); Hiro Nakayama, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 565 days.

(21) Appl. No.: 17/800,169

(22) PCT Filed: Feb. 12, 2021

(86) PCT No.: PCT/JP2021/005177
§ 371 (c)(1),
(2) Date: Aug. 16, 2022

(87) PCT Pub. No.: WO2021/116678
PCT Pub. Date: Aug. 26, 2021

(65) Prior Publication Data
US 2023/0073768 A1 Mar. 9, 2023

(30) Foreign Application Priority Data
Feb. 18, 2020 (JP) .................................. 2020-025573

(51) Int. Cl.
*H03F 1/56* (2006.01)
*H03F 3/19* (2006.01)
*H05H 1/46* (2006.01)

(52) U.S. Cl.
CPC ................ *H03F 1/56* (2013.01); *H03F 3/19* (2013.01); *H03F 2200/387* (2013.01); *H05H 1/46* (2013.01)

(58) Field of Classification Search
CPC ........ H03F 1/56; H03F 3/19; H03F 2200/387; H05H 1/46; H05H 2242/26; H01J 37/32183; H01J 37/32155; H03H 7/40
(Continued)

(56) References Cited

U.S. PATENT DOCUMENTS 5,892,198 A 4/1999 Barnes et al.
8,781,415 B1 7/2014 Coumou et al.
(Continued)

FOREIGN PATENT DOCUMENTS

CN 103650645 A 3/2014
CN 107924804 A 4/2018
(Continued)

OTHER PUBLICATIONS

Notification of Reason for Refusal dated Jun. 13, 2023, issued in counterpart Japanese Application No. 2020-025573 (14 pages; w/ English machine translation).
(Continued)

*Primary Examiner* — Andrea Lindgren Baltzell
*Assistant Examiner* — Khiem D Nguyen
(74) *Attorney, Agent, or Firm* — WHDA, LLP

(57) ABSTRACT

The present invention controls, within a frequency range, an output command value not to exceed the upper limit of an output command permitted by a high-frequency amplifier. A method for controlling a high-frequency power supply device and the high-frequency power supply device involve performing frequency control within a frequency range of variable frequencies, limiting the upper limit of an output command value for controlling an output of a high-fre-
(Continued)

quency amplifier within the frequency range of variable frequencies on the basis of an output limit value, and thereby preventing damaging of the high-frequency amplifier caused by an excessive command.

9 Claims, 23 Drawing Sheets

(58) Field of Classification Search
USPC .......................................................... 330/297
See application file for complete search history.

(56) References Cited

U.S. PATENT DOCUMENTS

| | | | |
|---|---|---|---|
| 2006/0220573 A1 | 10/2006 | Kotani et al. | |
| 2006/0220656 A1 | 10/2006 | Tanaka et al. | |
| 2014/0203821 A1* | 7/2014 | Yamamoto | H01L 22/14 |
| | | | 324/654 |
| 2017/0054418 A1 | 2/2017 | Coumou et al. | |
| 2018/0151332 A1 | 5/2018 | Kaneko et al. | |

FOREIGN PATENT DOCUMENTS

| | | |
|---|---|---|
| JP | 10-257774 A | 9/1998 |
| JP | 2006-310245 A | 11/2006 |
| JP | 2010-114001 A | 5/2010 |
| JP | 2013-197080 A | 9/2013 |
| JP | 2014-207214 A | 10/2014 |
| WO | 2017/030816 A1 | 2/2017 |

OTHER PUBLICATIONS

International Search Report dated Mar. 30, 2021, issued in counterpart International Application No. PCT/JP2021/005177. (2 pages).
Office Action dated May 15, 2024, issued in counterpart TW Application No. 110100366, with English translation. (15 pages).
Extended (Supplementary) European Search Report dated Feb. 15, 2024, issued in counterpart EP Application No. 21756211.5. (8 pages).
Office Action dated May 21, 2025, issued in counterpart KR Application No. 10-2022-7027019, with English translation. (10 pages).
Office Action dated Aug. 18, 2025, issued in counterpart CN Application No. 202180015278.4, with English translation. (33 pages).

* cited by examiner

FIG.8
(a)
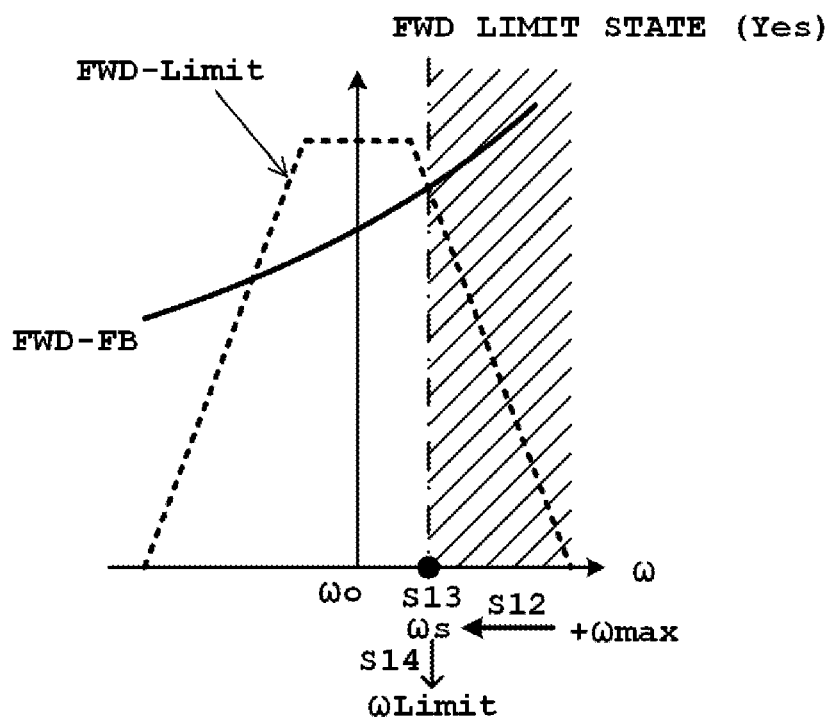
(b)
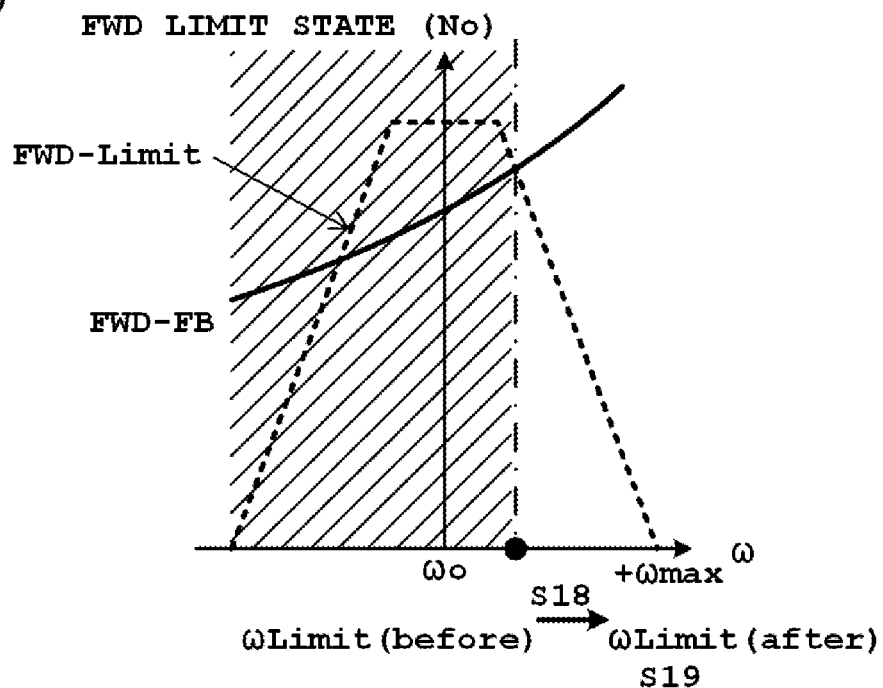

FIG.9
(A) OUTPUT LIMIT VALUE CONTROLLED STATE FWD-FB ≥ FWD-limit
CONTROL VALUE ← FWD-Limit
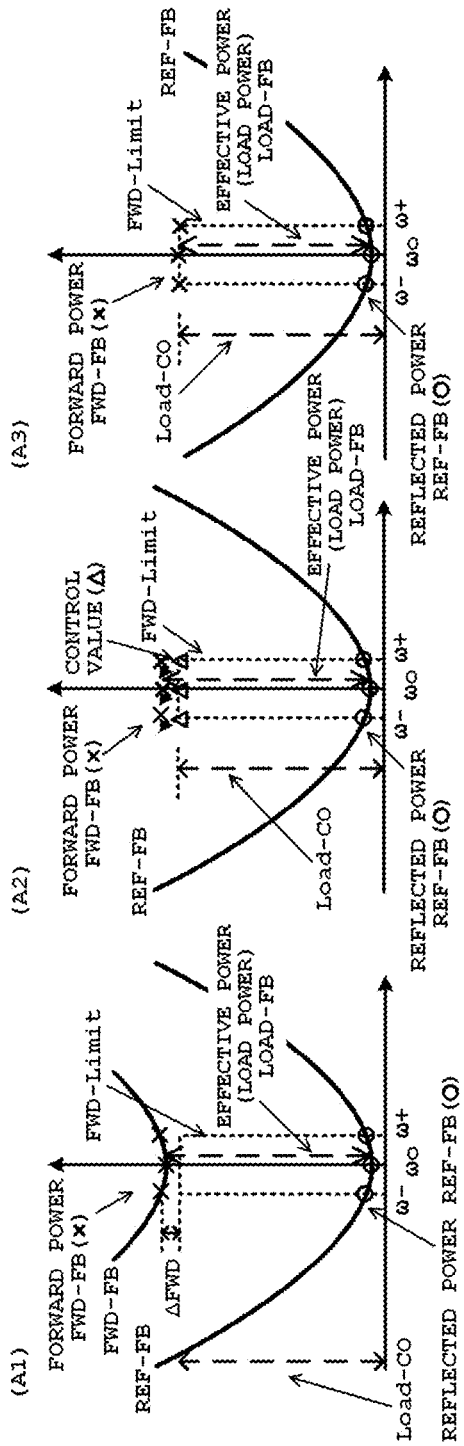
(B) OUTPUT LIMIT VALUE CONTROLLED STATE FWD-FB < FWD-limit
CONTROL VALUE ← Load-CO
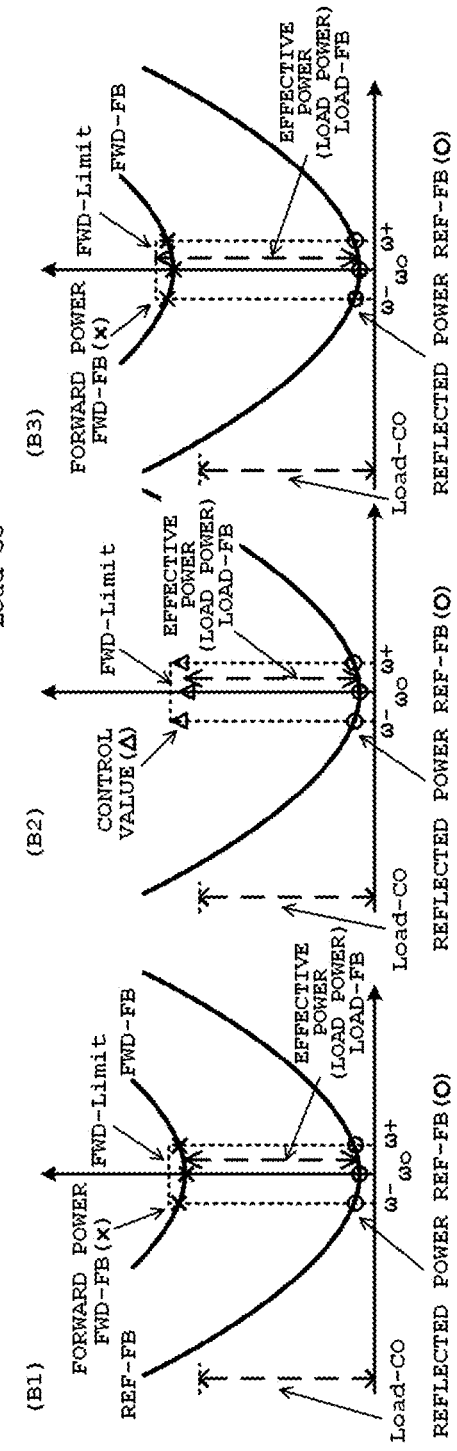

FIG.10 (A) OUTPUT LIMIT VALUE CONTROLLED STATE CONTROL VALUE ← FWD-Limit
FORWARD POWER VALUE ≥ FWD-limit
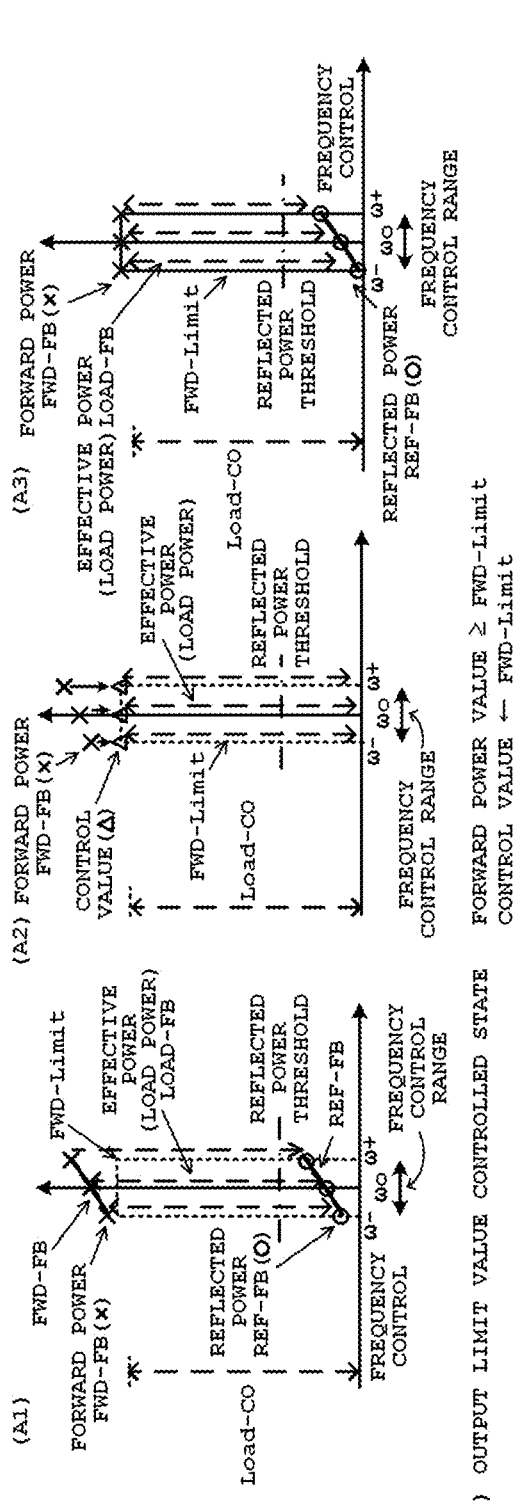
(B) OUTPUT LIMIT VALUE CONTROLLED STATE  FORWARD POWER VALUE ≥ FWD-Limit
CONTROL VALUE ← FWD-limit
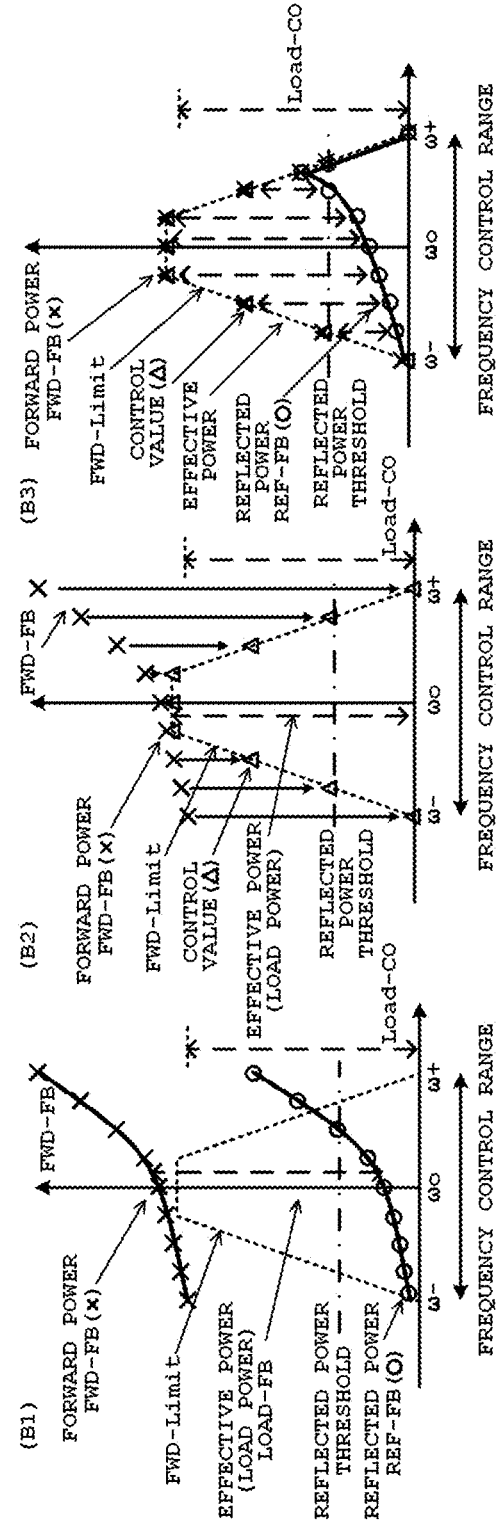

FIG.13
(a) OUTPUT LIMIT VALUE CONTROL / REF LIMIT VALUE CONTROL
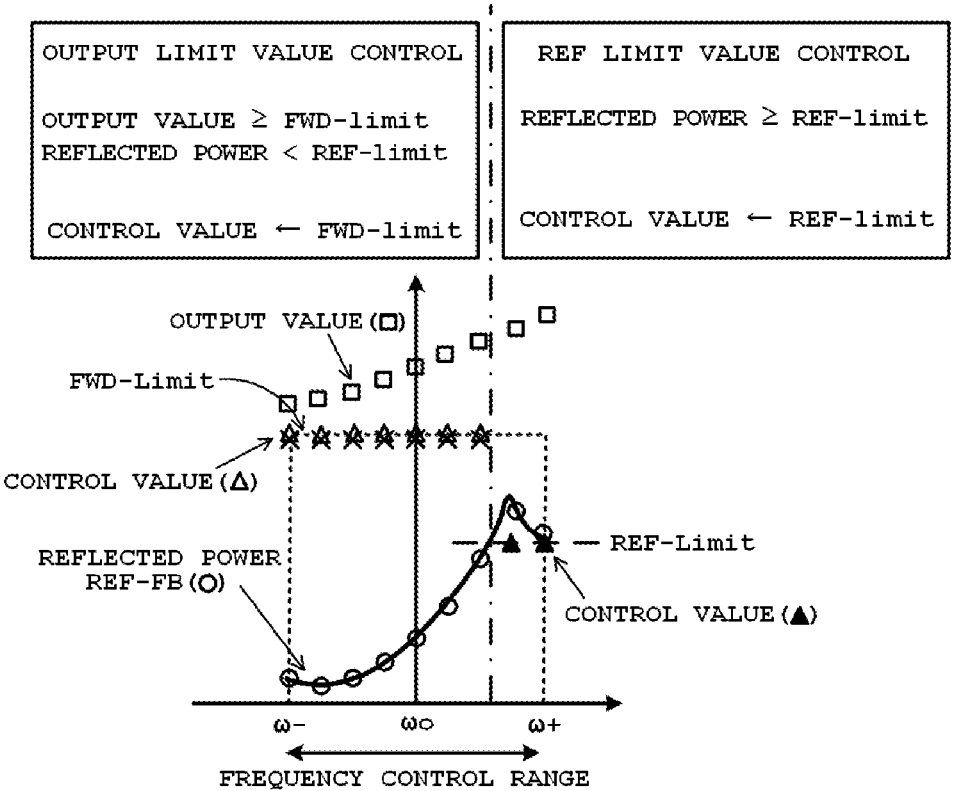
(b)
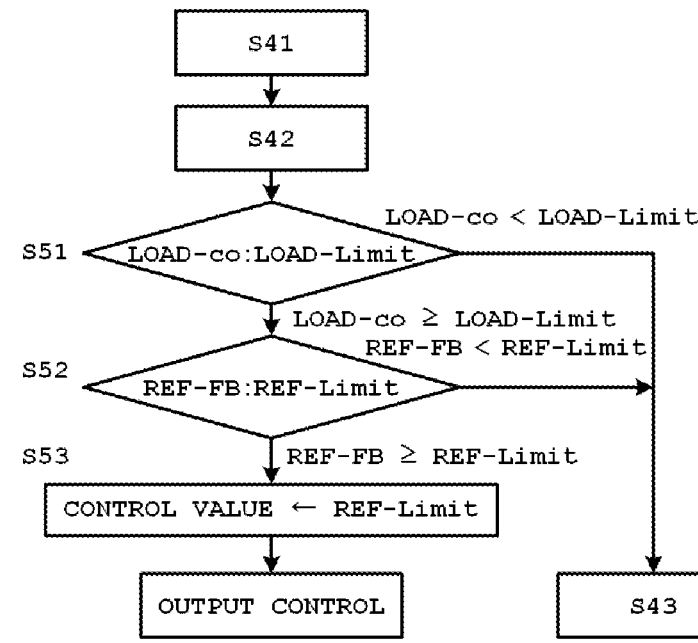

FWD-Limit = FWD-Limit (CENTER FREQUENCY) − ΔP × %Freq

FIG.21
(a) 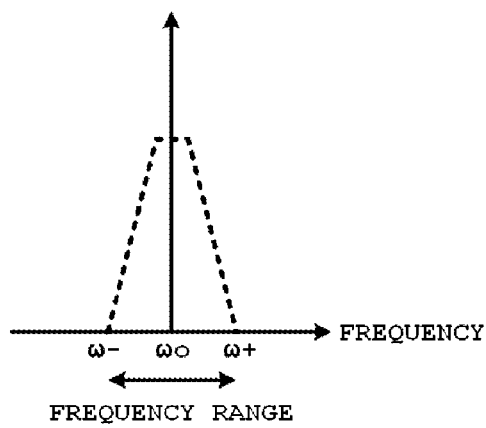
(b) 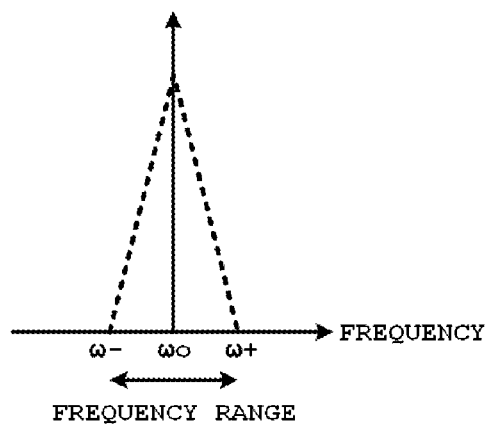
(c) 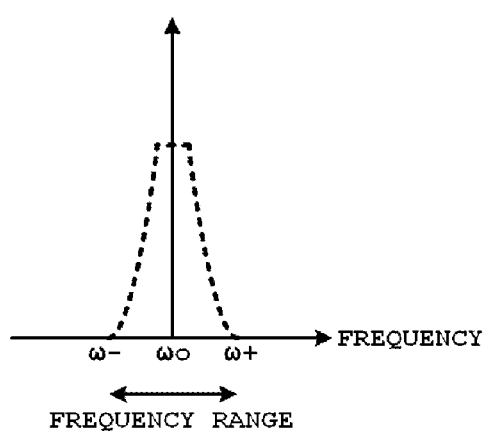
(d) 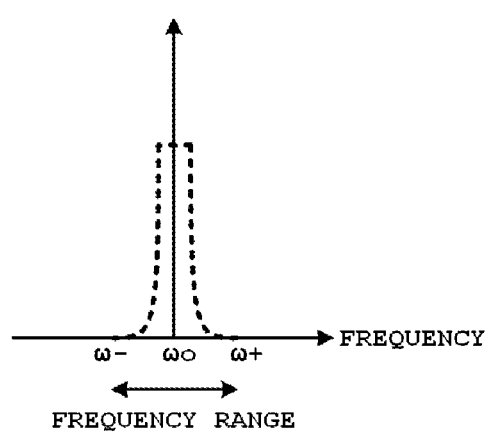
(e) 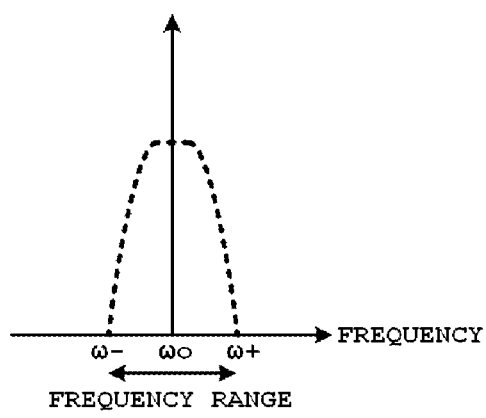
(f) 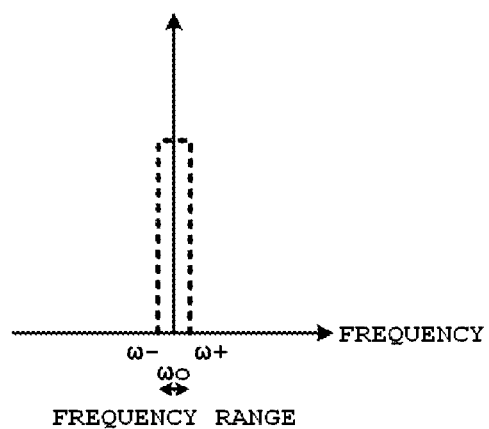

METHOD FOR CONTROLLING HIGH-FREQUENCY POWER SUPPLY DEVICE, AND HIGH-FREQUENCY POWER SUPPLY DEVICE

TECHNICAL FIELD

The present invention relates to a method for controlling a high-frequency power supply device and the high-frequency power supply device for supplying high-frequency power to a load.

BACKGROUND ART

For efficient supply of high-frequency power from a high-frequency power supply device to a load, there is a known technique to perform impedance matching in accordance with impedance fluctuations in the load to reduce reflected power. For example, in the case of plasma load, an impedance of the load fluctuates in the course of transition of plasma from an unignited state to an ignited state, or depending on the change in an environment of a chamber, such as gas condition and pressure condition. When impedance mismatch occurs due to the fluctuation in the impedance of the load, reflected power returning from the load to a high-frequency power supply device increases, resulting in decrease in load power to be effectively supplied to the load. In here, the load power is power obtained by subtracting the amount of reflected power returning from the load from forward power supplied from the high-frequency power supply device to the load, and the load power is effectively supplied to the load.

There is a known impedance matching technique that detects reflected power returning from a load to a high-frequency power source, and increases forward power to be supplied from the high-frequency power source to the load in accordance with the detected reflected power, so as to complement the decrease in load power caused by the reflected power.

Patent Literature 1 describes impedance matching by frequency control. When the decrease in load power is complemented by adding power equivalent to reflected power to forward power, the forward power may become excessive when the reflected power is large, and consequently an output becomes excessive. In order to reduce excessive output, Patent Literature 1 discloses a technique that controls frequency to reduce a reflected wave, and then adjusts an output such that power equivalent to the reflected power is added to the forward power after controlling (see Patent Literature 1).

Patent Literature 2 describes a technique of limiting a frequency range of a variable frequency in impedance matching by frequency control, in which an oscillating frequency is changed such that an absolute value of a reflectivity coefficient is minimized in a predetermined frequency range that includes a reference frequency. When the oscillating frequency is changed, an impedance of a load may fluctuate significantly even if the extent of variation of the oscillating frequency is small. When the impedance of the load fluctuates significantly, a voltage applied to the load is reduced, causing the difficulty in maintaining electrical discharge. For this reason, Patent Literature 2 limits a frequency range in the frequency control to prevent the reduction in supplied power (see Patent Literature 2).

CITATION LIST

Patent Literature

[Patent Literature 1] Japanese Patent Laid-Open Publication No. 2013-197080
[Patent Literature 2] Japanese Patent Laid-Open Publication No. 2006-310245 (paragraph 0073)

SUMMARY OF THE INVENTION

Problems to be Solved by the Invention

As described above, the frequency control is a control mode for changing an oscillating frequency. This control mode limits a frequency range of a variable frequency in the frequency control in order to prevent an impedance from changing significantly due to the change in the oscillating frequency.

As a problem in the frequency control, Patent Literature 2 refers to the reduction in the supplied power due to the fluctuation in the load impedance. In Patent Literature 2, the frequency range of the variable frequency is limited to prevent the reduction in the supplied power. In this case, the variable frequency is limited in the frequency range in the frequency control, and a frequency not in the frequency range is not subjected to the frequency control.

Thus, under the load condition that the range of fluctuation in the impedance becomes large, there is a problem that the frequency control may not be performed adequately in a limited and narrow frequency range, and it is desired that the frequency control can be performed in a wider frequency range.

In the frequency control, an output of a high-frequency amplifier included in a high-frequency power supply device is increased to compensate the reduction in the output due to the limitation of output characteristics of the high-frequency amplifier. In this case, the increase in the output of the high-frequency amplifier gets larger when the frequency range of the variable frequency is expanded, and thereby a voltage or current applied to a capacitor or coil, which is a constituent element of a circuit such as a high-frequency filter, may increase and exceed a rated value.

The increase in the output in the high-frequency amplifier occurs because open loop characteristics of the high-frequency amplifier are not flat with respect to the load impedance. The increase in an output value in the high-frequency amplifier is not sufficient to an output command value depending on loads. The frequency control seeks to resolve the insufficiency of the increase in the output value by further increasing the command value for the high-frequency amplifier.

FIG. 23 is a diagram illustrating the relationship between the open loop characteristics of a high-frequency amplifier and output control. It is to be noted that FIG. 23 shows an outline of the open loop characteristics, but not actual characteristics. In the figure, a lateral axis and a longitudinal axis denote a frequency and an output of the high-frequency amplifier, respectively, and a solid line, a broken line and a dashed-dotted line denote the open loop characteristics of the high-frequency amplifier, flat open loop characteristics, and an upper limit value of the output of the high-frequency amplifier, respectively.

The high-frequency amplifier has open loop characteristics that depend on a frequency. Thus, when an output command value $P_{command1}$ intending to obtain flat output characteristics is used, an output value $P_{out}$ becomes smaller than the output command value $P_{command1}$ due to the open loop characteristics. In order to increase the output value $P_{out}$, the high-frequency amplifier performs the output control to generate an output command value $P_{command2}$ larger than the output command value $P_{command1}$. In this case, the output command value $P_{command2}$ may exceed an upper limit value $P_{limit}$ of an output of the high-frequency amplifier.

An output command value that exceeds the upper limit value of the output of the high-frequency amplifier may cause damage to circuit elements of the high-frequency amplifier and a filter. It is therefore required that the output command value to the high-frequency amplifier does not exceed the upper limit so as to protect the constituent elements of the circuit.

An object of the present invention is to solve the above-described drawbacks, and to supply to the load with preset load power (LOAD power) or forward power (FWD power) in the frequency range of the variable frequency of the frequency control while controlling the output command value not to exceed an upper limit of an output command acceptable to the high-frequency amplifier.

Means for Solving the Problem

The present invention has modes of a controlling method for a high-frequency power supply device and the high-frequency power supply device, and performs frequency control in a frequency range of a variable frequency as well as limiting an upper limit of an output command value for controlling an output of a high-frequency amplifier to an output limit value, so as to prevent damage to the high-frequency amplifier due to an excessive output command and reduce reflected power.

(Method for Controlling High-Frequency Power Supply Device)

A method for controlling a high-frequency power supply device of the present invention includes:

(1) output control for controlling an output of the high-frequency power supply device based on an output command; and (2) impedance matching control for matching impedances between a high-frequency amplifier for outputting high frequency power by DC-AC conversion and a load, in which the output control and the impedance matching control are performed separately. A load to be supplied with the power by the control according to the invention is, for instance, a plasma load in which an impedance state fluctuates.

The impedance matching control includes:

(A) frequency control for performing impedance matching by changing a control frequency based on a feedback signal of the high-frequency amplifier; and (B) frequency limit value control for determining a frequency limit value for defining a frequency range in the frequency control, in which (C) the frequency control performs the impedance matching by controlling a frequency of the high-frequency amplifier in the frequency range of the frequency limit value determined by the frequency limit value control.

The impedance matching control limits a frequency range of a variable frequency in the frequency control, and limits the frequency range, so as to control an output command value not to exceed an upper limit of an output command acceptable to the high-frequency amplifier.

The output control further includes (D) output limit value control for determining an output limit value for controlling an output in the frequency range, in which (E) an output from the high-frequency amplifier is controlled based on the output command value in which the output limit value determined by the output limit value control is an upper limit.

(F) The output control and the impedance matching control are performed separately.

The impedance matching control of the present invention keeps the upper limit of the output command value to the output limit value determined by the output limit value control in the frequency control for performing the impedance matching, so as to control the output command value not to exceed an upper limit of an output command acceptable to the high-frequency amplifier.

(High-Frequency Power Supply Device)

A high-frequency power supply device of the present invention is for supplying high frequency power to a load, and includes:

a high-frequency amplifier that outputs high frequency power;

an output control unit that performs output control on an output of the high-frequency power supply device; and a control unit for impedance matching control that performs frequency control on the output of the high-frequency amplifier to match impedances between the output and the load.

The impedance matching control unit includes:

(a) a frequency control unit that performs the impedance matching by fluctuating a control frequency by using a control frequency based on a feedback signal from the high-frequency amplifier; and (b) a frequency limit value control unit that determines a frequency limit value for defining a frequency range of the frequency control, in which the frequency control unit controls (c) a frequency of the high-frequency amplifier in the frequency range of the frequency limit value determined by the frequency limit value control unit.

In the frequency control for performing the impedance matching, the control unit keeps the upper limit of the output command value by the output limit value determined by the output limit value control to control the output command value not to exceed the upper limit of the output command acceptable to the high-frequency amplifier.

In addition to that, the output control unit includes (d) performing the output limit value control for determining the output limit value for limiting an output control value in the output control unit in the frequency range, in which (e) an output of the high-frequency amplifier is controlled with the output command value that sets the output limit value determined by the output limit value control to an upper limit.

(f) The output control unit and the impedance matching control unit are controlled separately.

(Limit Value Control: Frequency Limit Value Control and Output Limit Value Control)

The frequency control is for changing a control frequency to achieve impedance matching between the high-frequency power supply device and a load. In the frequency control, when a frequency at the time of the impedance matching is used as a reference frequency, the greater a deviation of the control frequency from the reference frequency, larger a difference between an output command value and an output feedback signal. Thus, the output command value is increased to eliminate the difference.

Frequency characteristics of the impedance matching have in a frequency range of a variable frequency a lower output limit value at the end of the frequency than an output limit value in the center of the frequency. The present invention adopts limit control to the frequency control for impedance matching having frequency characteristics, the limit control including frequency limit value control in the frequency control for impedance matching and limit value control for output limit value control in the output control with respect to the frequency characteristics of the impedance matching.

The frequency limit value control is for controlling a frequency range of a variable frequency, and the output limit value control is for controlling an increased output command value not to exceed a value acceptable to a high-frequency amplifier, in which an output limit value is determined and used as an upper limit to limit the output command value.

The limit control limits the frequency range by the frequency limit value control and limits the output command value by the output limit value control, so as to limit the output command value with respect to the control frequency obtained in the course of the frequency control, and thus controls the output command value not to exceed the upper limit of the output command acceptable to the high-frequency amplifier.

(Frequency Limit Value Control)

The frequency limit value control determines a frequency limit value for a control frequency to be controlled in the impedance matching control for performing the impedance matching by the frequency control, and makes the control frequency variable in a frequency range defined by the determined frequency limit value.

(Output Limit Value Control)

The output limit value control is for limiting an output command value to an output limit value in a frequency range of a variable frequency, and when the output command value exceeds the output limit value, limiting the output command value to the output limit value, so as to control such that the output command value exceeding the output limit value is not output to the high-frequency amplifier.

The output limit value has frequency characteristics that may show that the output limit value is a constant value in the frequency range, or that the output limit value is a different value in the frequency range. For example, the frequency characteristics sets, in a frequency range of a variable frequency, an output limit value at the end of the frequency to be lower than an output limit value in the center of the frequency.

The output limit value control limits the upper limit of the output command value to the output limit value to keep the output command value from increasing beyond the output limit value in order to prevent damage to circuit elements of the high-frequency amplifier and others due to an excessive output voltage produced by the increase in the output as the output command value increases. The frequency characteristics of the output command value largely depend on the frequency characteristics of the impedance of the load. Since an output command value typically has characteristics of becoming so large as the deviation of a control frequency from a reference frequency is larger, the frequency characteristics of an output command value having a control frequency higher than a reference frequency and the frequency characteristics of an output command value having a control frequency lower than the reference frequency are almost symmetrical.

As above, if it is conceivable that the output command value at the higher frequency and the output command value at the lower frequency have similar and almost symmetrical frequency characteristics with respect to the reference frequency, the frequency characteristics of the output limit value can be set such that the frequency characteristics at the higher frequency and the frequency characteristics at the lower frequency are symmetrical with respect to the reference frequency in a frequency range of a variable frequency.

Furthermore, in a frequency range of a variable frequency, the frequency characteristics of the output command value having a control frequency higher than a reference frequency may be different from the frequency characteristics of an output command value having a control frequency lower than the reference frequency. For example, the frequency characteristics may differ between the control frequency higher than the reference frequency and the control frequency lower than the reference frequency because open loop characteristics of a high-frequency amplifier has substantial influence on the frequency characteristics of an output limit value. In such a case, as the frequency characteristics is asymmetric with respect to the reference frequency, the frequency characteristics of the output limit value can be set to be asymmetric with respect to the reference frequency in the frequency range of the variable frequency.

The output limit value can be set in various ways in accordance with output patterns in a high-frequency power supply device, and is defined relative to an output command for responding to a plurality of feedback signals used for the frequency control.

(Feedback Signal)

The frequency control and the limit control use signals of the high-frequency amplifier obtained on an output end of the high-frequency power supply device as feedback signals of the high-frequency power supply device. The feedback signals may be of forward power (FWD power), reflected power (REF power), load power (LOAD power), and an output voltage. On the other hand, signals of a DC power source on an input end of the high-frequency power supply device may be of a DC voltage or direct current, and loss power is caused in the power supply by the high-frequency power supply device. The load power can be obtained by subtracting the reflected power from the forward power.

The feedback signals of the forward power, the reflected power, the load power and the output voltage change depending on fluctuations of a load impedance, and the frequency control controls a frequency of an output from the high-frequency amplifier based on these feedback signals. Furthermore, the feedback signals of the DC voltage and the direct current indicate an output state of the DC power source which supplies drive power to the high-frequency amplifier, and have an effect on fluctuations of the power to be supplied to the load as with the fluctuations of the load impedance.

The frequency control controls the frequency of the output from the high-frequency amplifier based on the feedback signals to perform impedance matching, thereby matching impedances between the high-frequency power supply device and the load to reduce the reflected power in response to the effects of the fluctuations of the load impedance and the fluctuations in the output state of the DC power source. In addition to that, the output control is performed separately from the frequency control so that the power supply achieves a target power level. The target power level may be forward power or load power, for instance, and is controlled such that an output of the high-frequency power supply device reaches a forward power command value or load voltage command value.

Output limit values that correspond to the feedback signals of the forward power, the reflected power and the output voltage are a forward power limit value, a reflected power limit value and an output voltage limit value, respectively. Output limit values that correspond to the DC voltage and the direct current of the DC power source are a DC voltage limit value and a direct current limit value, respectively.

A loss power limit value for a feedback signal of loss power is an output limit value for loss power occurring during the power supply from the high-frequency power supply device to the load. In here, the loss power is a loss occurring during the power supply by the high-frequency power supply device that corresponds to power calculated by subtracting effective power from supplied power, that is to say, calculated by subtracting forward power and reflected power from the power supplied by the high-frequency power supply device.

The output limit value can be defined for at least one of the above-described plurality of feedback signals, or the output limit value may be defined for an arbitrary combination of the plurality of feedback signals.

Effects of the Invention

As described above, in accordance with the present invention, in the frequency range of the variable frequency in the frequency control, the set load power (LOAD power) or forward power (FWD power) is supplied to the load, while the output command value is controlled not to exceed the upper limit of the output command acceptable to the high-frequency amplifier.

BRIEF DESCRIPTION OF THE DRAWINGS

FIG. 8 illustrates the frequency limit value control;
FIG. 9 illustrates an operation state of FWD limit value control;
FIG. 10 illustrates another operation state of the FWD limit value control;
FIG. 13 shows a selection between the FWD limit value control and REF limit control;
FIG. 21 illustrates another example of the frequency characteristics of the FWD limit value.

BEST MODE FOR CARRYING OUT THE INVENTION

Figure 22:
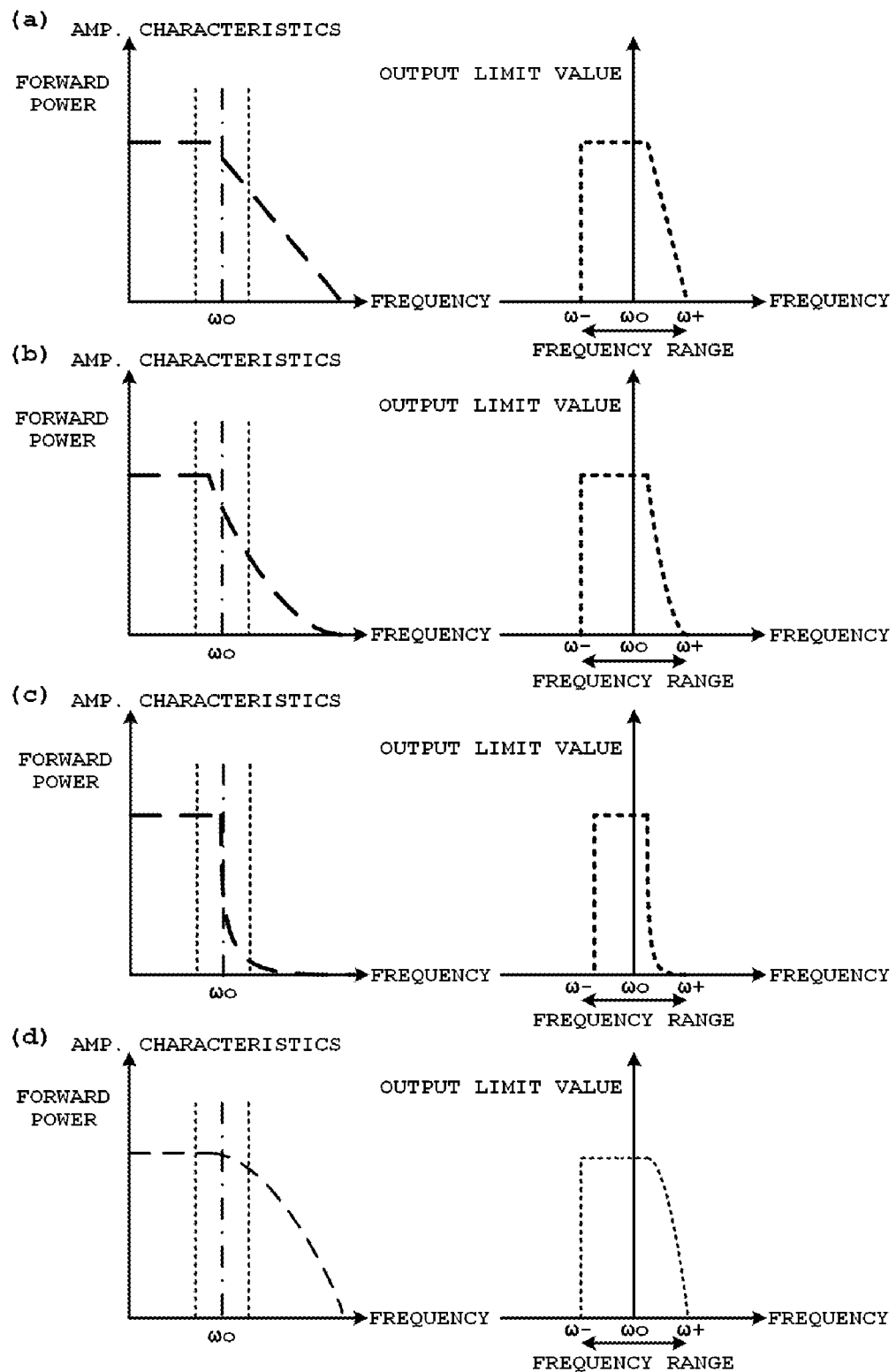
FIG. 22 illustrates yet another example of the frequency characteristics of the FWD limit value.
Figure 23:
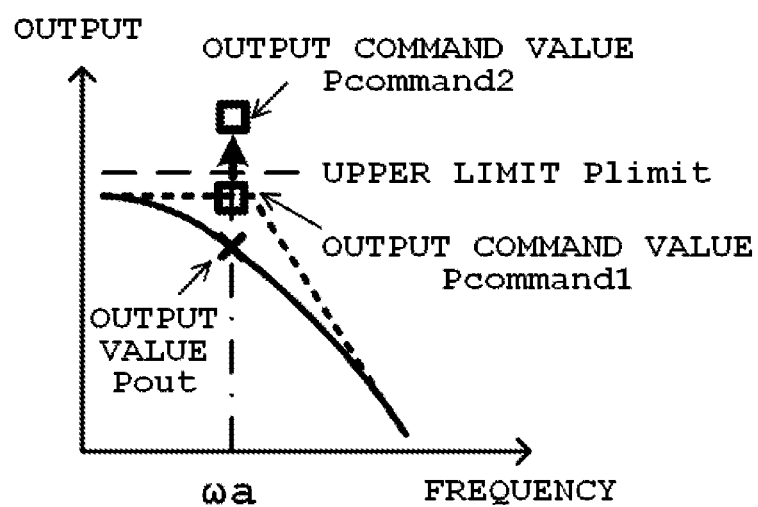
FIG. 23 illustrates a relationship between open loop characteristics of a high-frequency amplifier and output control.

Now, outlines of a high-frequency power supply device and a controlling method according to the present invention will be described with reference to FIGS. 1 to 5, frequency control and limit control will be described with reference to FIGS. 6 to 18, an example of a configuration of the high-frequency power supply device will be described with reference to FIG. 19, and some examples of frequency characteristics of a forward power limit value will be described with reference to FIGS. 20 to 22. In regard to the frequency control and the limit control, examples using an output command as a load power command (LOAD power command) will be described.

Figure 1:
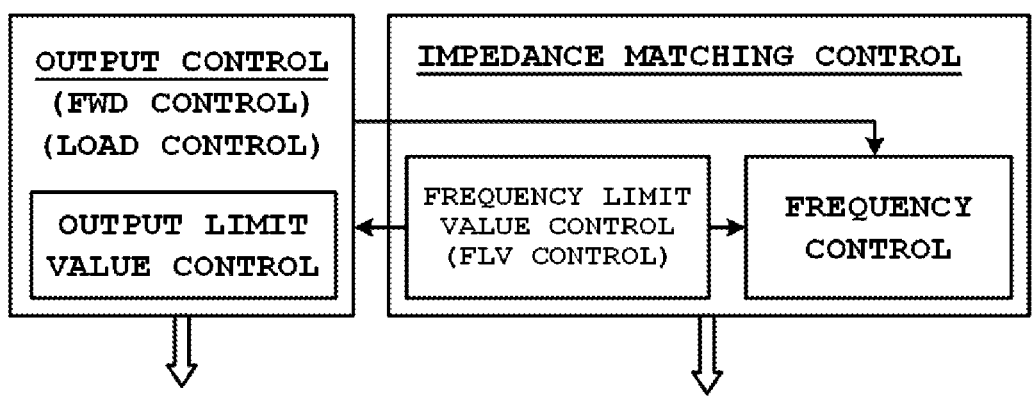
FIG. 1 illustrates an outline of a high-frequency power supply device of the present invention.
Figure 2:
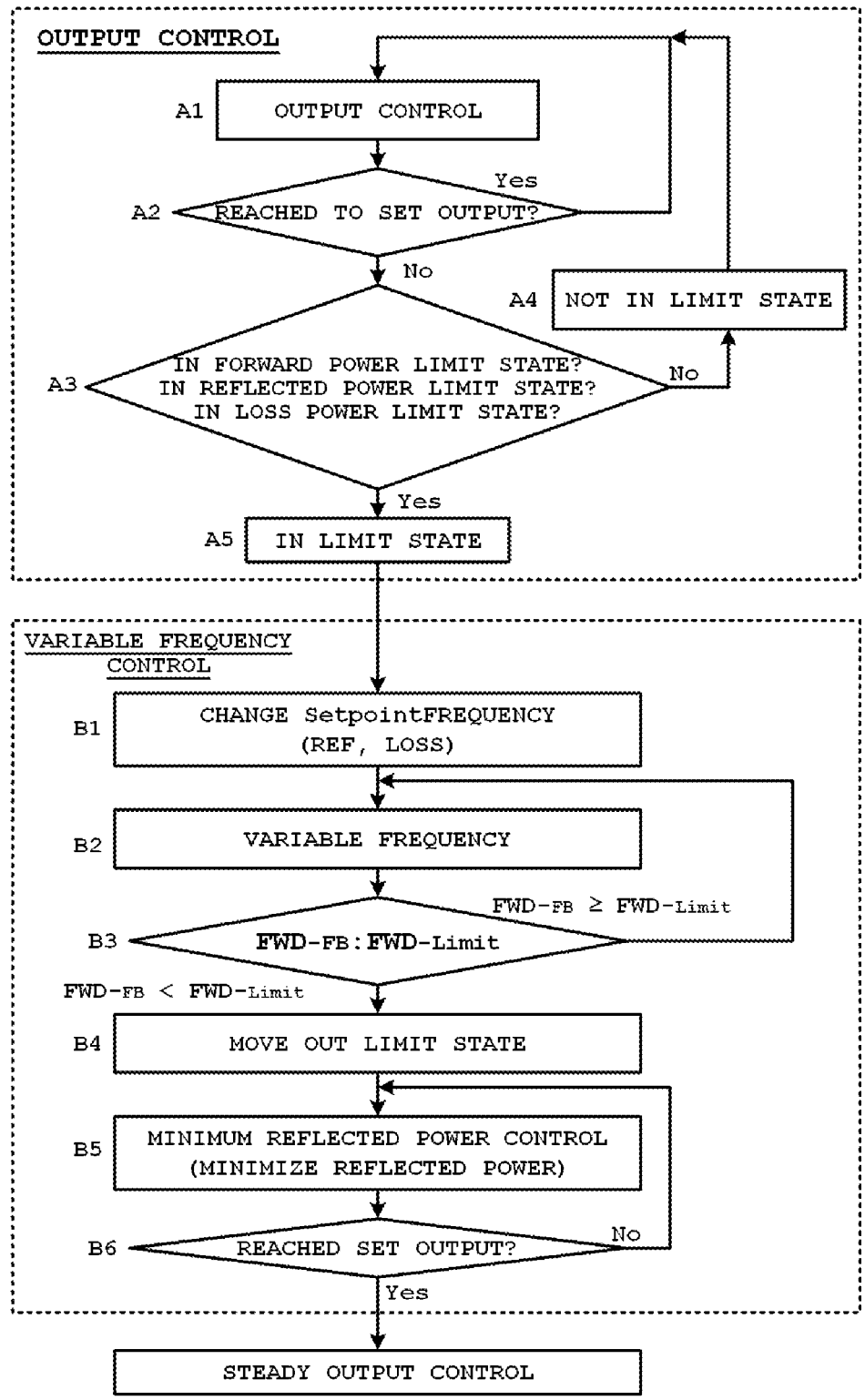
FIG. 2 is a flowchart illustrating a shift from output control to frequency control on the rising edge of an output voltage.
Figure 3:
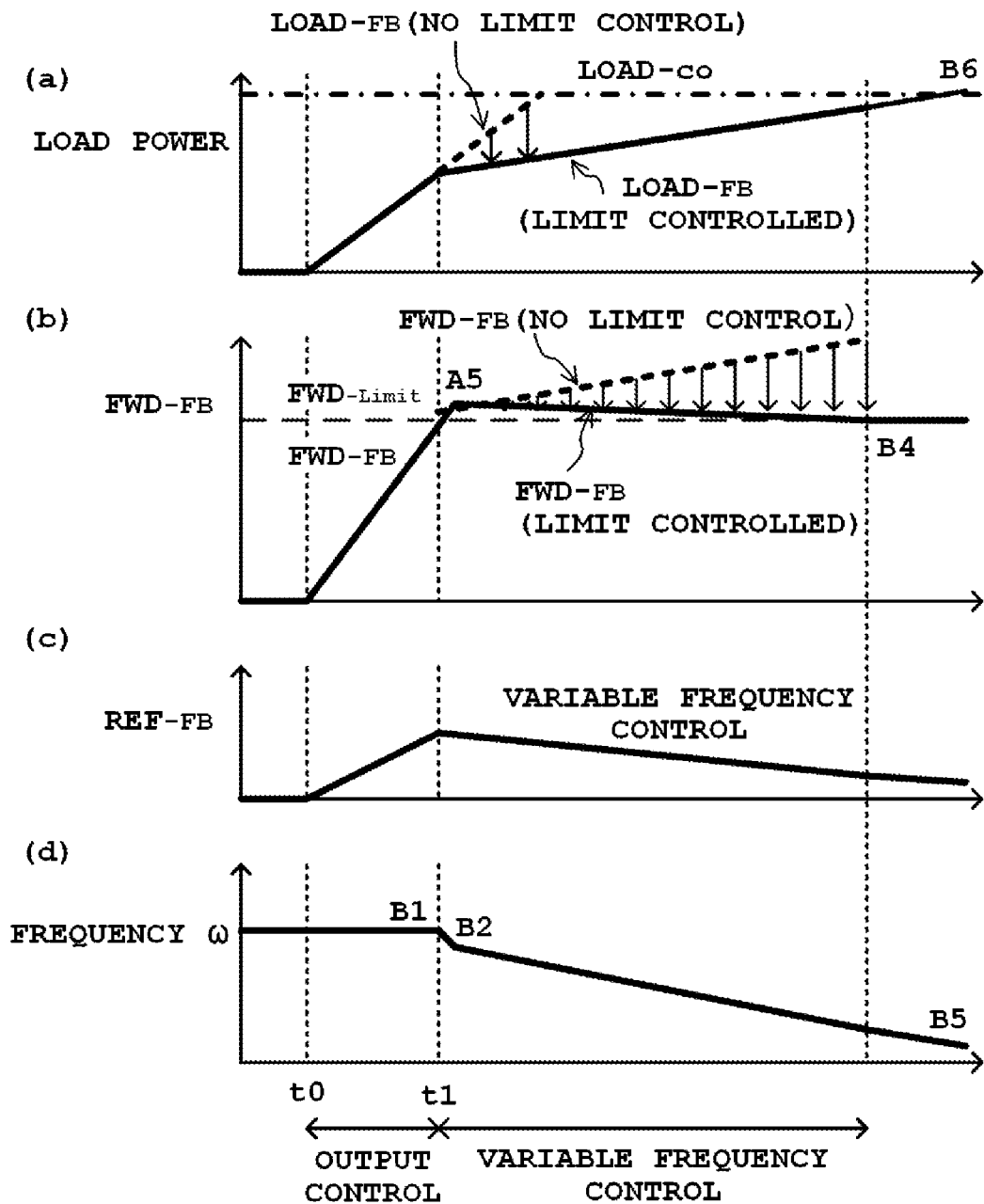
FIG. 3 is a waveform chart showing a changing state of power for illustrating the shift from the output control to the frequency control on the rising edge of the output voltage.

FIG. 1 is a schematic view showing a method for controlling a high-frequency power supply device and the high-frequency power supply device, and FIGS. 2 and 3, respectively, are a flowchart illustrating shift from output control to frequency control on the rising edge of an output voltage and a waveform chart showing a changing state of power.

Figure 4:
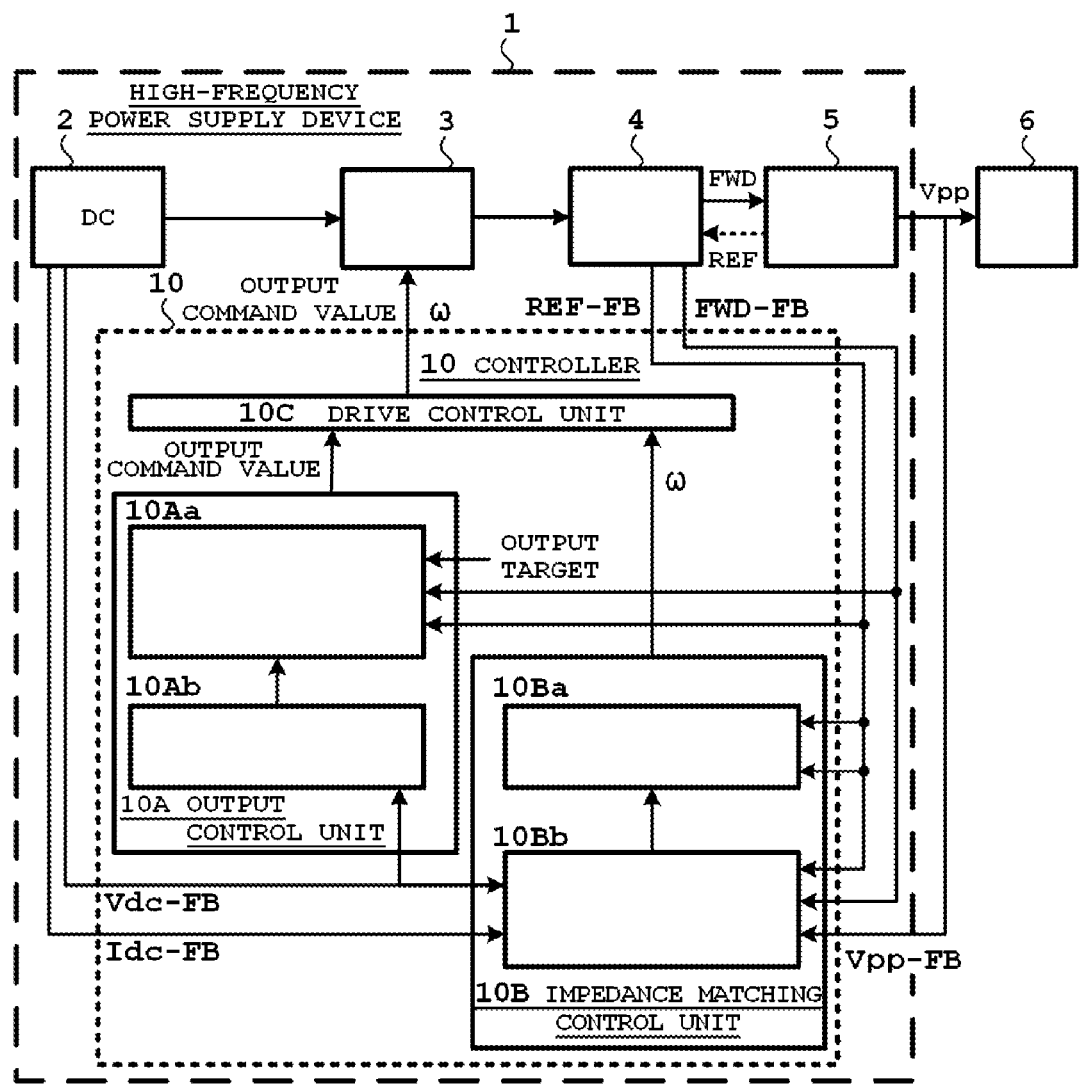
FIG. 4 illustrates a schematic configuration of the high-frequency power supply device of the invention.
Figure 5:
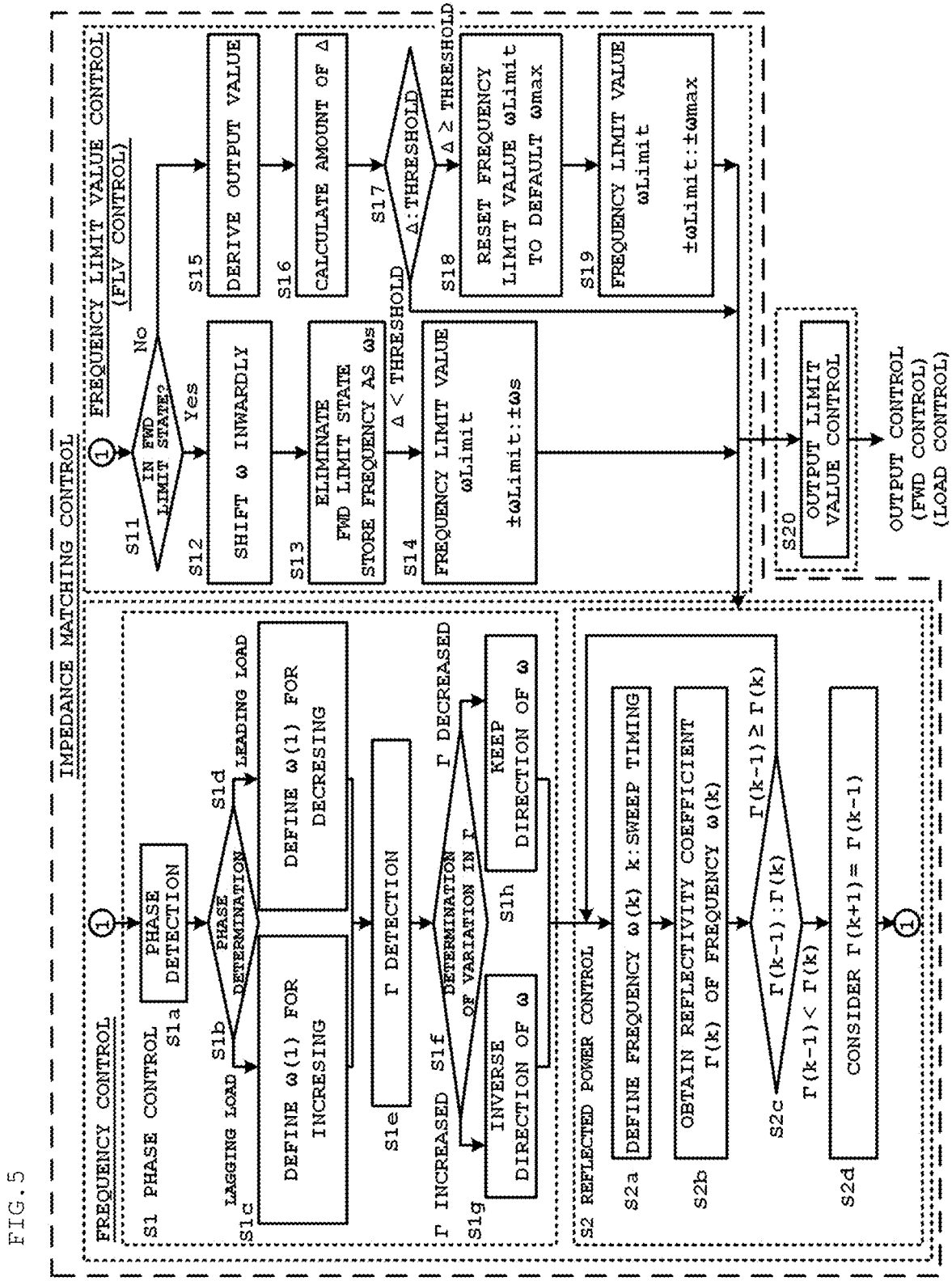
FIG. 5 is a flowchart of impedance matching control by the frequency control and frequency limit value control.

FIG. 4 illustrates a schematic configuration of the high-frequency power supply device of the present invention, and FIG. 5 is a flowchart showing impedance matching control by the high frequency control and frequency limit value control.

Figure 6:
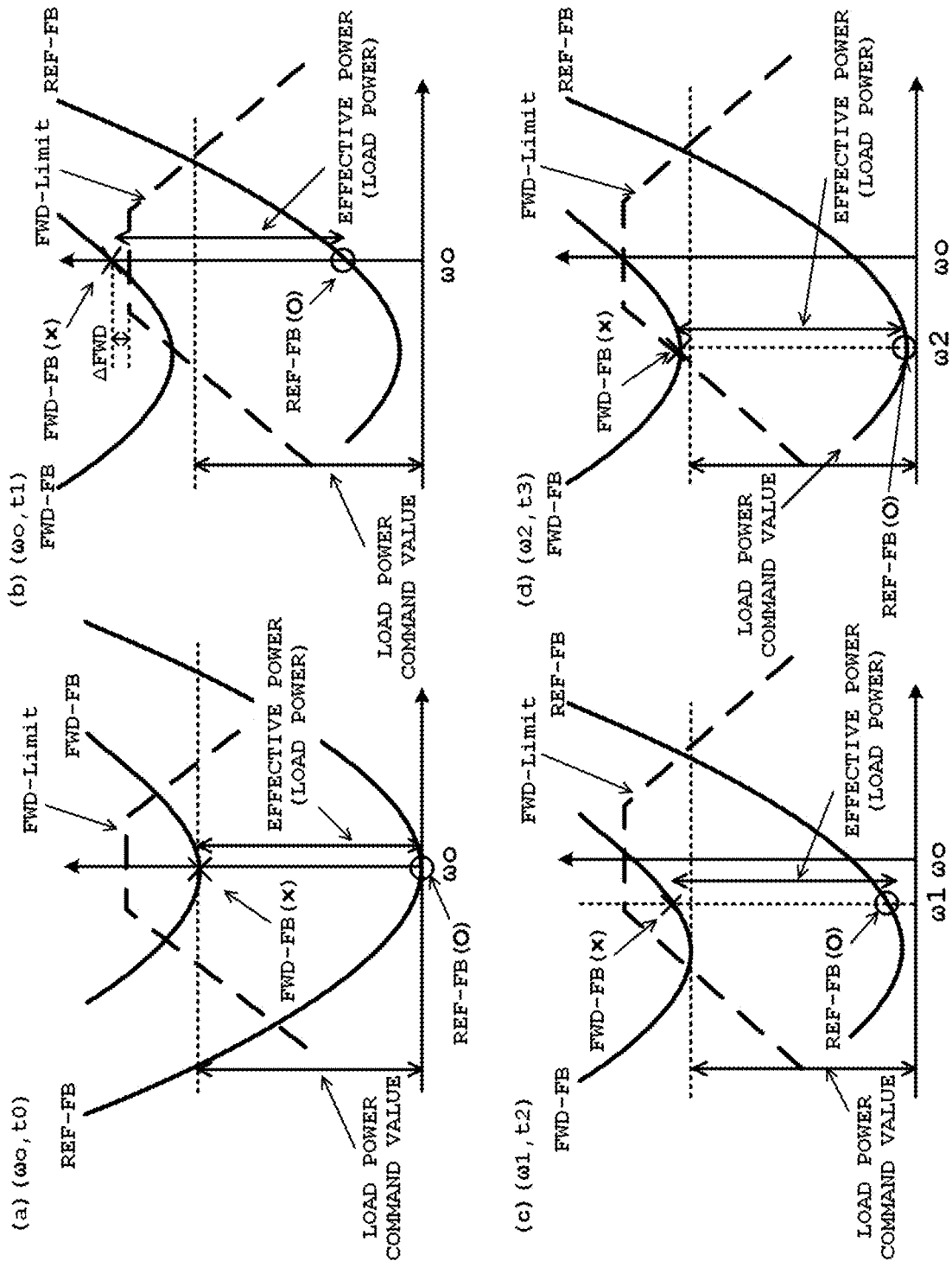
FIG. 6 is a diagram showing output frequency characteristics in the frequency control.
Figure 7:
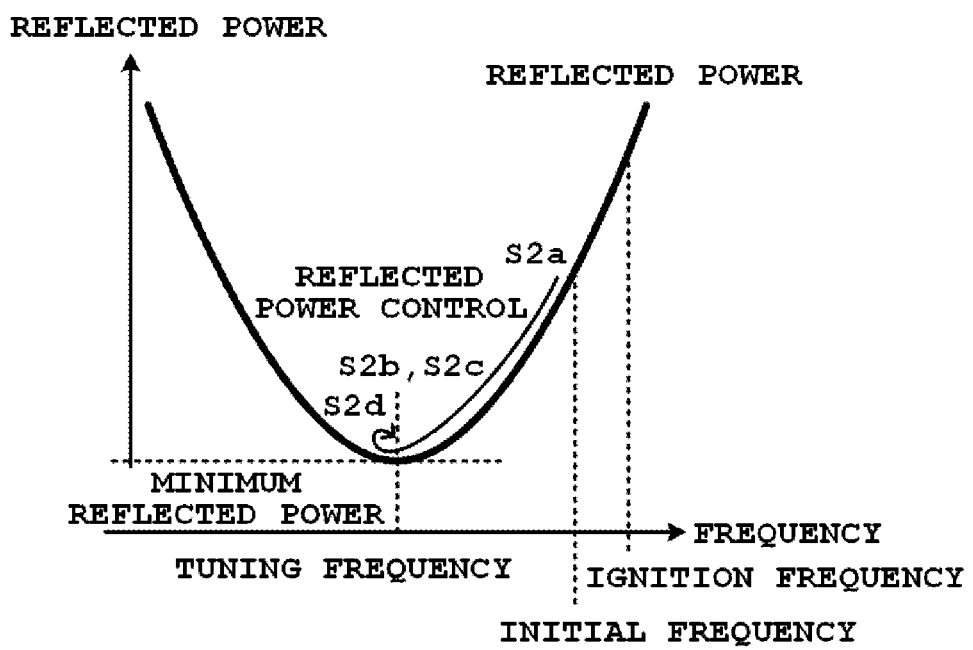
FIG. 7 illustrates steps of S2 in reflected power control.

Frequency control and limit control illustrated in FIGS. 6 to 18 are some examples of the control in which a load power command is used as an output command. FIG. 6 is a diagram showing output frequency characteristics in the frequency control, FIG. 7 illustrates tuning of reflected power control, FIG. 8 illustrates frequency limit value control, FIGS. 9 and 10 illustrate operation states in output limit value control (FWD limit value control (forward power limit control-value controlling)), FIGS. 11 and 12, respectively, show flowcharts of frequency limit value control and output limit value control and a diagram showing frequency characteristics, and FIG. 13 shows a selection between output limit value control (FWD limit value control (forward power limit control-value controlling)) and REF limit control (reflected power limit control-value controlling).

Figure 14:
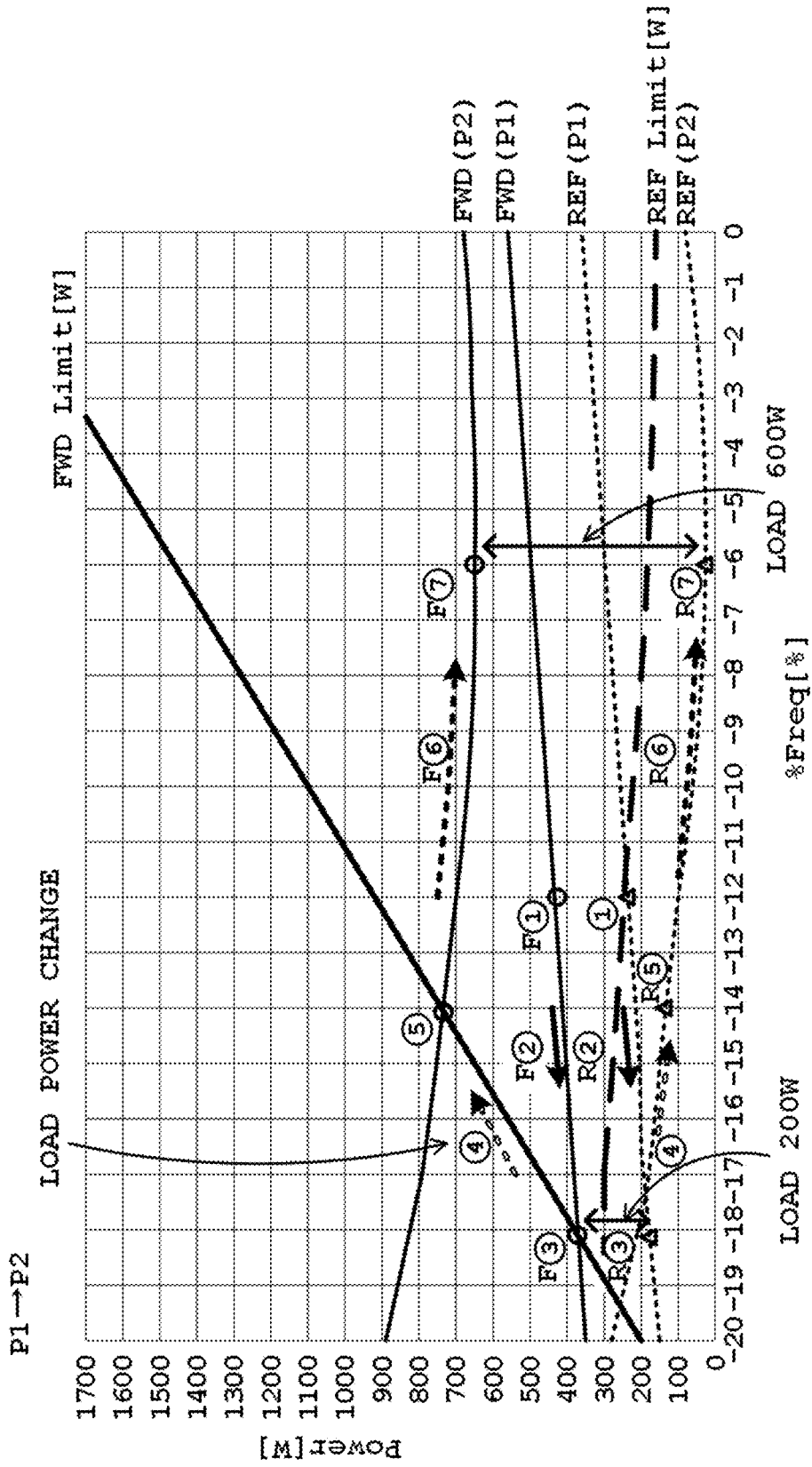
FIG. 14 illustrates switching (P1 to P2) of load power (LOAD power)
Figure 15:
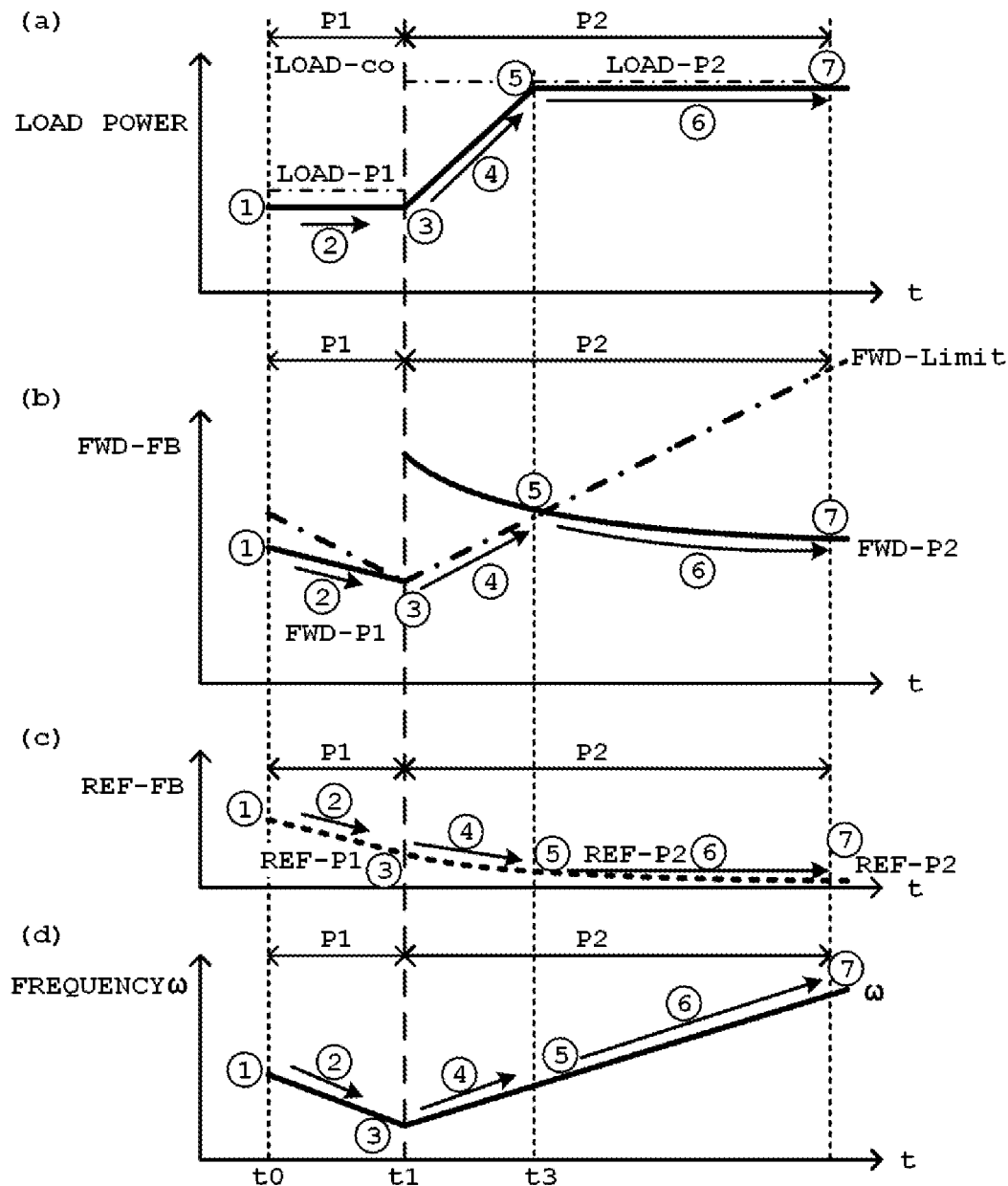
FIG. 15 is a diagram of power change illustrating the switching (P1 to P2) of the load power (LOAD power)
Figure 16:
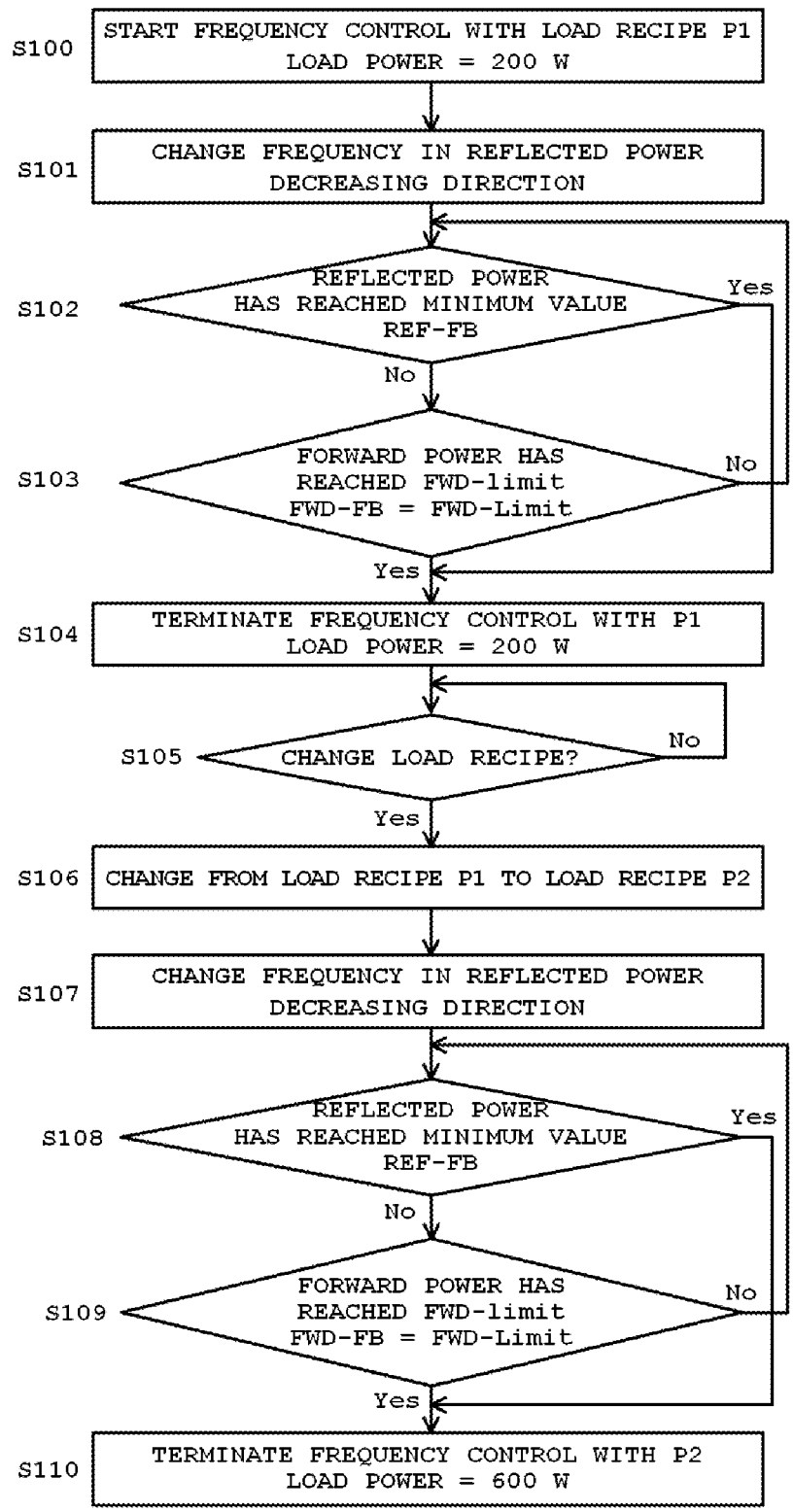
FIG. 16 is a flowchart illustrating the switching (P1 to P2) of the load power (LOAD power)
Figure 17:
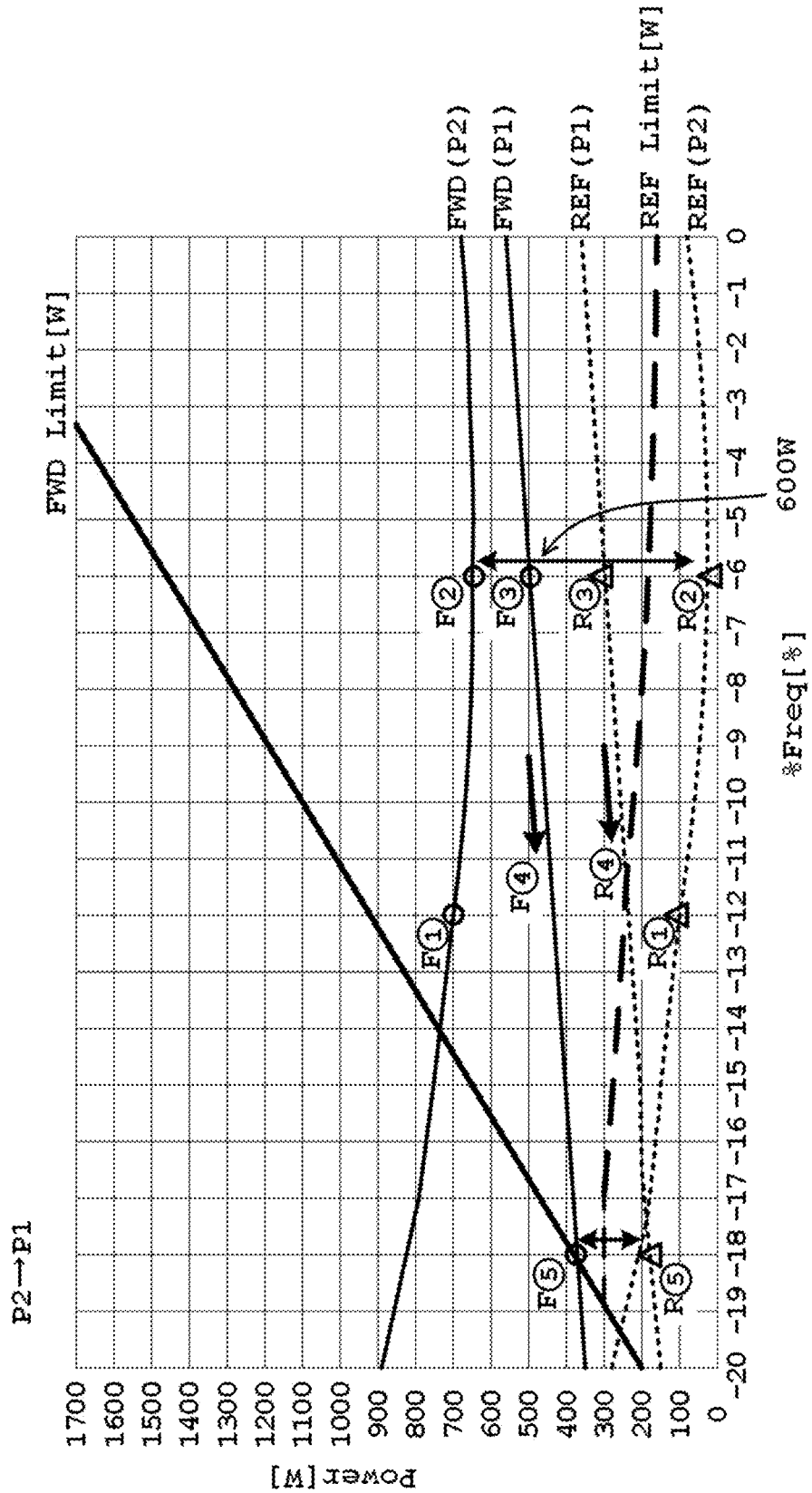
FIG. 17 illustrates switching (P2 to P1) of the load power (LOAD power)
Figure 18:
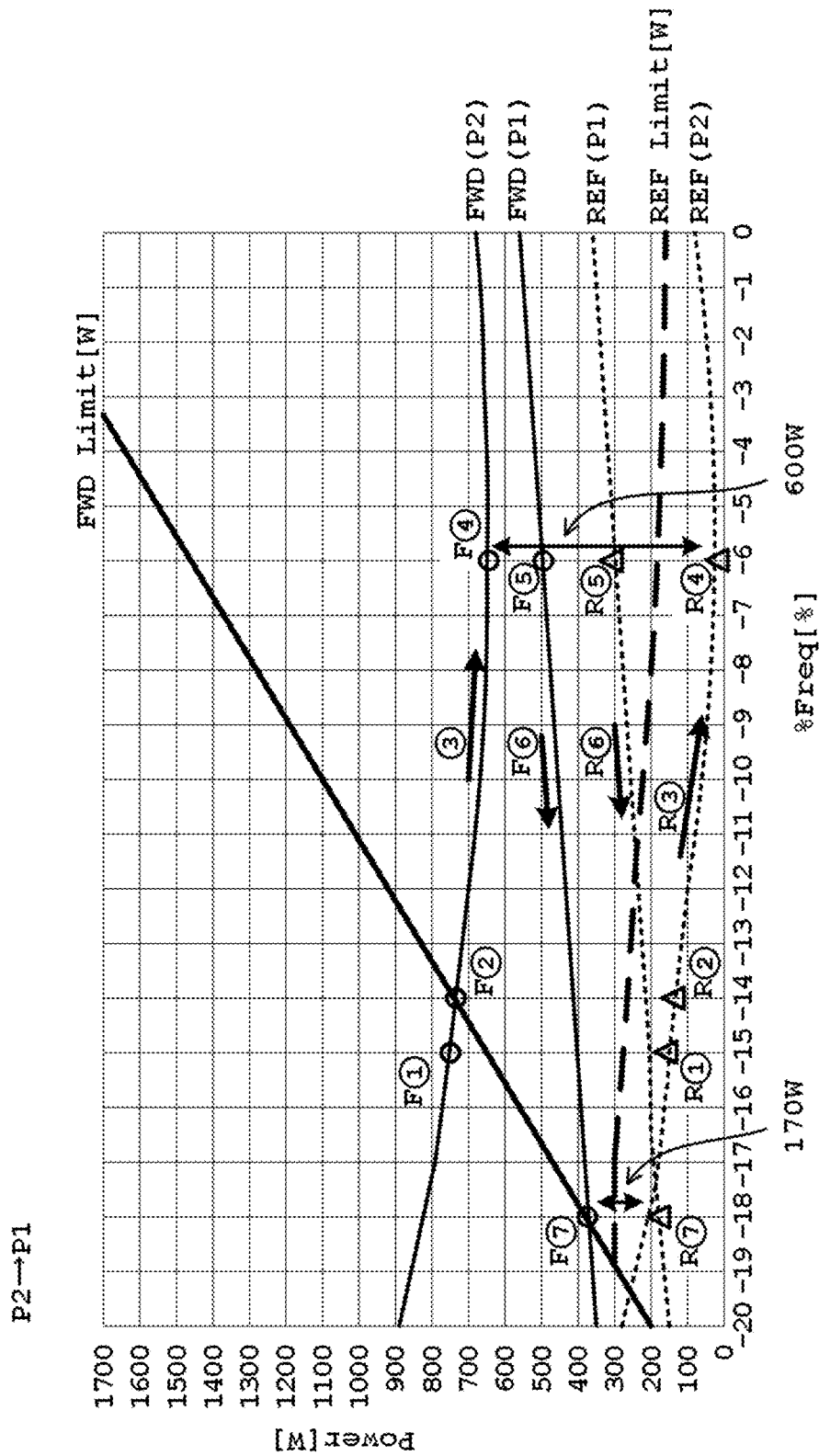
FIG. 18 illustrates another switching (P2 to P1) of the load power (LOAD power) when a start frequency is different from that in FIG. 17.
Figure 19:
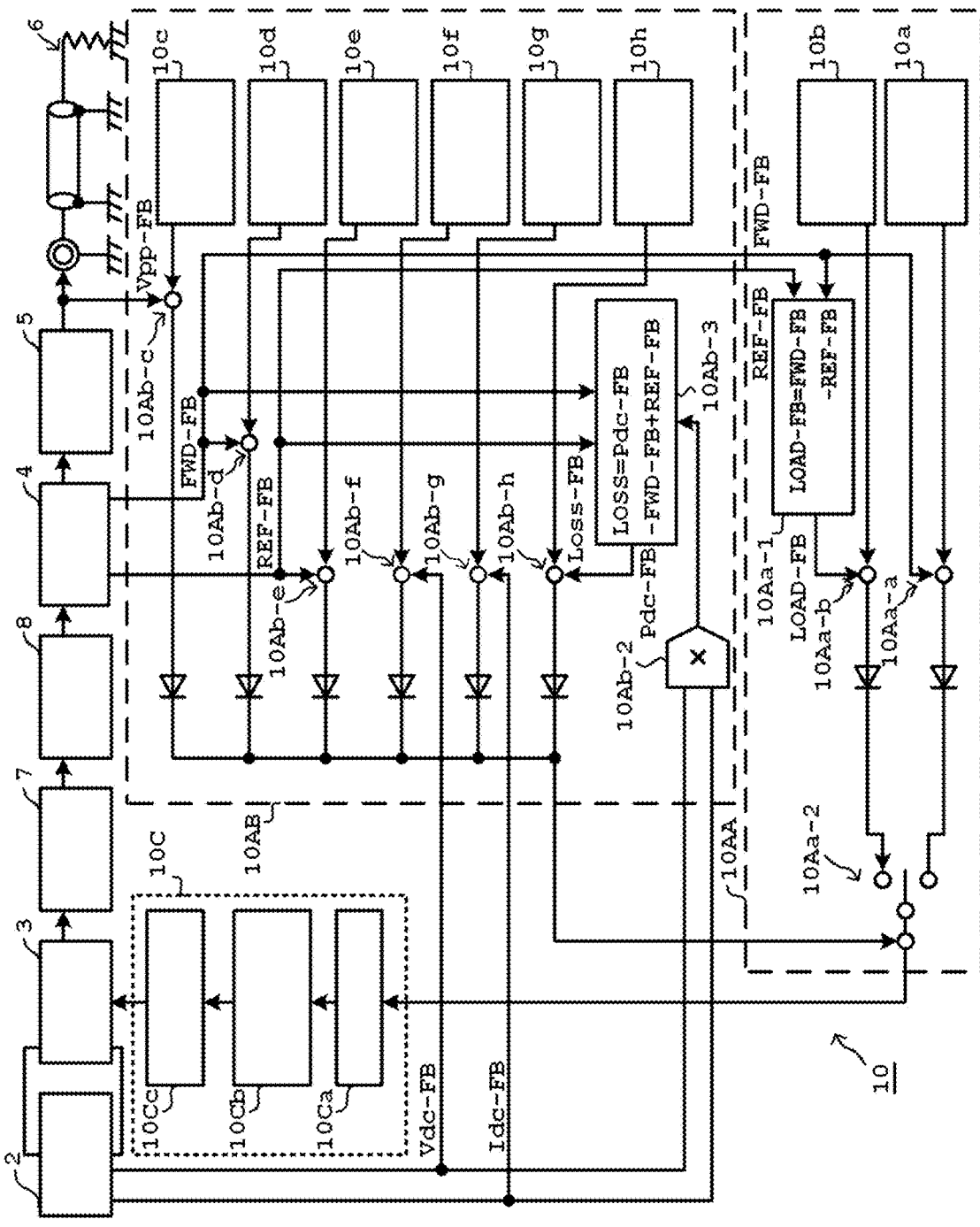
FIG. 19 illustrates an example of a configuration of the high-frequency power supply device of the invention.

FIGS. 14 to 18 illustrate switching of a load power command (LOAD power command), and FIGS. 14, 15 and 16, respectively, are a diagram illustrating frequency-power characteristics during the switching of the load power command from P1 to P2, a diagram illustrating temporal change in power, and a flowchart illustrating the switching. FIGS. 17 and 18 illustrate the frequency-power characteristics during the switching of the load power command from P2 to P1. In this regard, an example of a start frequency in FIG. 17 and an example of a start frequency in FIG. 18 are different from each other. FIG. 19 illustrates an example of a configuration of the high-frequency power supply device of the invention. FIG. 20 shows an example of frequency characteristics of a forward power limit value, and FIGS. 21 and 22 show different examples of the frequency characteristics of the forward power limit value.

By referring to FIG. 1, a method for controlling a high-frequency power supply device and a schematic configuration of the high-frequency power supply device of the present invention will now be described.

(Schematic Configuration and Outline of Control)
  (Output Control and Impedance Matching Control)

In the control of the high-frequency power supply device of the present invention, output control for controlling an output of the high-frequency power supply device to a set output and impedance matching control for matching impedances between the high-frequency power supply device and a load are performed separately. FIG. 1 shows an outline of the control of the high-frequency power supply device of the invention.

In FIG. 1, the output control is for controlling power supplied from the high-frequency power supply device to the load to be predetermined power according to a command value. The output control can employ forward power control (FWD control) for controlling forward power (FWD power) sent from the high-frequency power supply device toward the load or load power control (LOAD control) for controlling load power (LOAD power) supplied to the load. The load power (LOAD power) corresponds to power calculated by subtracting reflected power (REF power) returning from the load to the high-frequency power supply device from the forward power (FWD power) sent from the high-frequency power supply device to the load (LOAD power=FWD power−REF power). Now, a description will be made about the output control by taking load power (LOAD power) control as an example. The load power (LOAD power) control is for controlling load power calculated by subtracting a reflected wave feedback value (REF-FB) from a forward power feedback value (FWD-FB) to get toward a load power command value (LOAD-CO).

The impedance matching control is for matching impedances between the high-frequency power supply device and the load. The impedance matching is performed to decrease the reflected power (REF power) returning from the load to the high-frequency power supply device while preventing the decrease in the load power (LOAD power) supplied from the high-frequency power supply device to the load.

The impedance matching control is for performing frequency control on an operation frequency of a high-frequency amplifier to match the impedances. In the impedance matching control, a frequency range in the frequency control is determined by frequency limit value control (FLV control). The frequency limit value control is for deriving frequency limit values according to a reflected power value (FWD power value). The frequency limit values are an upper limit frequency and a lower limit frequency defined by the frequency range in the frequency control. The frequency control performs the impedance matching with frequencies in the frequency range determined by the frequency limit values derived by the frequency limit value control. The method for controlling the high-frequency power supply device of the invention is for deriving a frequency limit value determined according to the forward power value (FWD power value) as needed, and updating the frequency range in the frequency control based on the derived frequency limit value.

On the other hand, the output control performs output limit control-value controlling in order to keep the power supplied to the load at an allowable power level. The output limit control-value controlling is for controlling the supplied power to be in the range of an output limit value by using the output limit value. The output control can adopt forward power control based on a forward power command or load power control based on a load power command.

The forward power control is for controlling an output command value for driving a high-frequency amplifier such that a forward power feedback value (FWD-FB) becomes a forward power command value (FWD-CO). The load power control is for controlling the output command value for driving the high-frequency amplifier such that load power (LOAD power) obtained by subtracting a reflected power feedback value (REF-FB) from the forward power feedback value (FWD-FB) becomes a load power command value (LOAD-CO).

The output limit value control keeps an upper limit of the output command value to the output limit value to thereby keep the supplied power within the range of the output limit value. As an output limit value, a FWD limit value or a LOAD limit value derived by the output limit value control is used.

When the FWD control is employed for the output control, the FWD control uses the FWD limit value derived by the FWD limit value control to control the upper limit of the forward power. Furthermore, when the LOAD control is employed for the output control, the LOAD control uses the LOAD limit value derived by the LOAD limit value control to control the upper limit of the load power.

When the forward power control is performed as the output control, the FWD limit value derived by the FWD limit value control is used as an output limit value. The FWD control of the output control uses the FWD limit value derived by the FWD limit value control to control the upper limit of the forward power.

Furthermore, when the load power control is performed as the output control, the LOAD limit value derived by the LOAD limit value control is used as an output limit value, so as to keep the load power command value to be smaller than or equal to the LOAD limit value as well as keeping a forward power command value calculated by adding a reflected power feedback (FER-FB) to the LOAD command value to be equal to or smaller than the FWD limit value.

The upper limit of the output command value is controlled to the output limit value by the output limit value control, thereby keeping supplied power within the range of the output limit value.

(Shift from Output Control to Frequency Control)

By referring to the flowchart and waveform chart respectively in FIGS. 2 and 3, the output control and variable frequency control by the high-frequency power supply device will be described. In here, FIG. 3 shows an example of a waveform of power.

The present invention performs the output control to supply load power (LOAD power) or forward power (FWD power) to a load, and performs the frequency control to minimize reflected power. In the output control, impedance mismatching occurring on the rising edge of output power, or due to a fluctuation in a load state or others may cause the increase in an output command value for outputting set load power (LOAD power) or forward power (FWD power). In the present invention, an output limit value for limiting the output command value is set, and when the output command value increases and exceeds the output limit value due to the output control, the mode of the control is shifted to the output limit control to limit the increase in the output command value.

The limitation on the output command value can limit the supply of the load power (LOAD power) or forward power (FWD power) to the load that leads to a shortage of power supply to the load, and consequently it may be difficult to boost the output power. In order to avoid such situation, variable frequency control is performed to move out an output limit state when the control mode is shifted to the output limit control, and minimum reflected power control is performed in an output-unlimited state after moving out of the output limit state to minimize the reflected power, and thereby set power is supplied to the load to perform steady output control. When the output command value exceeds the output limit value due to the impedance mismatching caused by, such as, load fluctuation in the steady output control, the control mode is shifted again to the output limit control, and the frequency control and the output control of the impedance matching control are performed separately. In here, the frequency control for moving out the limited state is referred to as variable frequency control, and the frequency control of the impedance matching control is referred to as frequency control.

The output control shown on the upper half of FIG. 2 illustrates how the output limit state occurs. In the figure, a set output is controlled by the output control (A1), and when the output limit state occurs (A3, A5) before the output reaches the set output (A2), the variable frequency control is performed to move out the output limit state.

The variable frequency control shown on the lower half of FIG. 2 illustrates how to move out the output limit state. After the variable frequency control is performed to move out the output limit state and then the minimum reflected power control is performed to minimize the reflected power, the out control and the impedance matching control are performed in the steady output control to control the supply of the set power.

The output limit state is, for example, a reflected power limit state where the reflected power exceeds a limit value, or a loss power limit state where loss power exceeds the limit value. In this output limit state, the variable frequency control is performed to change a setpoint frequency for a control frequency (B1), thereby changing the control frequency. The setpoint frequency is a frequency to be set arbitrarily for starting the variable frequency control (B2). By the variable frequency control, a forward power feedback value (FWD-FB) is reduced (B3) to fall below a forward power limit value (FWD-Limit), thereby moving out the output limit state (B4). In a state where the output limit state is eliminated, the minimum reflected power control is performed to minimize the reflected power, so as to increase the power supply to the load (B5). After the power supply to the load reaches the set output by minimizing the reflected power (B6), the control mode shifts to the steady output control to control the supply of the set power by the output control and the impedance matching control.

FIG. 3 shows some states of shifting from the output control (A) to the variable frequency control (B). FIGS. 3(a), 3(b) and 3(c) show changes in load power (LOAD power), a forward power feedback value (FWD-FB) and a reflected power feedback value (REF-FB), respectively, and FIG. 3(d) shows a control frequency co in the frequency control. In FIG. 3(a), a dashed-dotted line denotes a load power command value (LOAD-CO), a solid line denotes a load power feedback value (LOAD-FB) in the case where the limit control is performed, and a broken line denotes a load power feedback value (LOAD-FB) in the case where the limit control is not performed. In FIG. 3(b), a long broken line denotes forward power limit (FWD-Limit), a solid line denotes a forward power feedback value (FWD-FB) in the case where the limit control is performed, and a short broken line denotes an output value (forward power value) in the case where the limit control is not performed.

A section between t0 to t1 presents a state of the output control (A). The forward power feedback value (FWD-FB) is increased by the output control, and thus the reflected power feedback value (REF-FB) is also increased. The value of load power (LOAD power) is calculated by subtracting the reflected power feedback value (REF-FB) from the forward power feedback value (FWD-FB).

At a time point (t1) where the forward power feedback value (FWD-FB) exceeds the forward power limit (FWD-Limit) and goes into the output limit state, the control mode shifts from the output control (A) to the variable frequency control (B), so that the frequency is switched to the setpoint frequency (B1) to make the control frequency variable (B2). In the variable frequency control (B), the forward power (FWD) is limited by the forward power limit (FWD-Limit) and thereby decreases toward the forward power limit (FWD-Limit). In FIG. 3(b), if the limit control is not performed, the output value increases beyond a forward power limit (FWD-Limit) voltage as denoted by the short broken line, and when the limit control is performed, the output value decreases toward the forward power limit (FWD-Limit) as denoted by the solid line. In this situation, even though forward power (FWD) exceeding the forward power limit (FWD-Limit) is output to the load, a power rising period is relatively short that the high-frequency amplifier can tolerate, and thus the control mode is shifted to the steady output control after the power reaches the set output (B6). When the forward power (FWD) falls below the forward power limit (FWD-Limit), the output limit control is not required, thereby moving out the limit state (B4). Then, the minimum reflected power control is performed to minimize the reflected power (B5), so as to increase the LOAD power to be supplied to the load toward a LOAD power command value which is the set output (B6).

According to the control of the high-frequency power supply device of the present invention, the output control and the impedance matching control are performed separately, and the impedance matching control is performed in the frequency range obtained by the frequency limit value control, and the output control is performed to control the upper limit power based on the output limit value obtained by the output limit value control.

According to the control of the high-frequency power supply device of the present invention, since drooping control for drooping the forward power (FWD power) or the load power (LOAD power) is not performed as the output control, the output control and the impedance matching control can be performed without decreasing the output to be supplied to the load.

(Schematic Configuration)

A description about a schematic configuration of the high-frequency power supply device of the invention will be made with reference to FIG. 4. In FIG. 4, a high-frequency power supply device 1 includes a power supply source, a high-frequency amplifier 3, a high-frequency sensor 4, a matching unit 5 and a controller 10, and is configured to output a high-frequency output to a load 6. FIG. 4 shows load power control (LOAD control) or forward power control (FWD control) as an example of output control performed by the controller 10.

In the configuration example in FIG. 4, a DC power source 2 is employed as the power supply source of the high-frequency power supply device 1, but is not limited thereto, and an AC power source may be employed.

The high-frequency amplifier 3 is configured to convert DC power of the DC power source 2 into high-frequency AC power to generate high-frequency power. In a configuration using an AC power source as a power supply source, a frequency conversion is performed on an AC signal in the AC power source to thereby generate high-frequency AC power.

The high-frequency sensor 4 is configured to detect forward power FWD output from the high-frequency power supply device 1 to the load 6 and reflected power REF returning from the load 6 to the high-frequency power supply device 1, so as to feed back a feedback value FWD-FB of the detected forward power FWD and a feedback value REF-FB of the detected reflected power REF to the controller 10. The forward power FWD and the reflected power REF are separated and detected by a directional coupler, not shown, by way of example.

The matching unit 5 is a circuit for matching impedances of the high-frequency power supply device 1 and the load 6. The matching unit 5 is configured, for instance, to set a value of a circuit element of the matching unit 5 to match the impedance of the high-frequency power supply device 1 and the impedance of the load 6 during a steady operation, and this impedance matching minimizes the reflected power returning from the load 6 to the high-frequency power supply device 1 and maximizes the forward power proceeding from the high-frequency amplifier 3 to the load 6 during supplying maximum power. The matching unit 5 typically consists of a fixed coil and a fixed matching circuit using a fixed capacitor. Although the matching unit can consist of a variable matching circuit using a flammable capacity or variable coil, there are increases in costs of the matching unit itself as well as drive mechanisms, such as control circuit and motor, when the variable matching circuit is configured.

The matching unit 5 performs the impedance matching in a steady situation, and when an impedance matched state in the steady situation changes into an impedance mismatched state due to load fluctuation or others, the frequency control is performed on the high-frequency amplifier to eliminate the impedance mismatching.

The controller 10 performs the output control (FWD control or LOAD control) and the impedance matching control on the high-frequency amplifier 3.

The output control generates an output command value for enabling an output to reach a target value, so as to control the high-frequency amplifier 3. The output control in the forward power control (FWD control) is for generating an output command value for controlling forward power FWD toward a forward power target value. The output control in the load power control (LOAD control) is for generating an output command value for controlling forward power FWD to thereby make load power obtained by subtracting the reflected power feedback from the forward power feedback value to be set power.

The impedance matching control performs the impedance matching by controlling a frequency of an output when the impedance matched state changes from its steady state. In here, the steady state means a state where the impedances of the high-frequency power source and the load are matched, and the matching unit 5 consisting of the fixed matching circuit matches the impedances by defining values of the fixed coil and the fixed capacitor.

The controller 10 is configured to perform the frequency control to change a control frequency co of an output when the impedances are not matched, thereby performing the impedance matching to reduce reflected power while performing the output control to generate an output command value for controlling an output value output by the high-frequency amplifier 3.

The controller 10 generates the control frequency co by using a frequency control unit 10Ba based on feedback values FWD-FB and REF-FB, respectively, of the forward power FWD and the reflected power REF detected by the high-frequency sensor 4, a feedback value Vpp-FB of an output voltage Vpp detected on an output end of the high-frequency power supply device 1, and feedback values Vdc-FB and Idc-FB, respectively, of a DC voltage Vdc and a direct current Idc that supply power from the DC power source 2 to the high-frequency amplifier 3, and the output control unit (FWD control unit or LOAD control unit) in turn generates an output command value.

The controller 10 includes an output control unit 10A, an impedance matching control unit 10B and a drive control unit 10C, and performs the frequency control and the output control in the impedance matching control separately.

(Output Control Unit 10A)

The output control unit 10A has, in the case of performing the output control by forward power control (FWD control), an FWD control section as an output control section 10Aa and an FWD limit value control section as an output limit value control section 10Ab. In the case of performing the output control by load power control (LOAD control), the output control unit 10A has a LOAD control section as the output control section 10Aa and a LOAD limit value control section as the output limit value control section 10Ab.

The output control section 10Aa is configured to generate an output command value based on the feedback value FWD-FB of the forward power FWD and the feedback value REF-FB of the reflected power REF detected by the high-frequency sensor 4 as well as an output target value.

The output control section 10Aa controls an upper limit of the output command value based on an output limit value generated by the output limit value control section 10Ab.

The output limit value control section 10Ab is configured to keep an output limit value for defining an upper limit value of an output command value for every frequency in a frequency range of a variable frequency including a reference frequency, and when the output command value exceeds the output limit value, controls the upper limit of the output command value by replacing the output command value with the output limit value. As to the output limit value, when a control frequency determined by the frequency control is in the frequency range, a value corresponding to a control frequency at the time is read out.

In the case of performing the output control by the forward power control (FWD control), the output limit value control section 10Ab keeps a forward power limit value for defining an upper limit value of a forward power command value for every frequency in the frequency range of the variable frequency including the reference frequency, and when the forward power command value exceeds the forward power limit value, controls the upper limit of the forward power command value by replacing the forward power command value with the forward power limit value.

In the case of performing the output control by the load power control (LOAD control), the output limit value control section 10Ab keeps a forward power limit value for defining an upper limit value of a forward power command value for every frequency in the frequency range of the variable frequency including the reference frequency, and uses a load power command value as a forward power command value on the assumption that there is no reflected power, so as to control the upper limit of the load power command value by replacing the load power command value with the forward power limit value when the load power command value exceeds the forward power limit value.

(Impedance Matching Control Unit 10B)

The impedance matching control unit 10B includes a frequency control section 10Ba and a frequency limit value control section 10Bb.

The frequency control section 10Ba is configured to determine a control frequency ω of the high-frequency amplifier 3 based on feedback signals of a feedback value FWD-FB of forward power FWD, a feedback value REF-FB of reflected power REF and others, which are detected by the high-frequency sensor 4. Hereinafter, in the case of performing the frequency control repeatedly, a control frequency derived by the frequency control performed the last time is used as a reference frequency ωo, and a frequency change is performed from the reference frequency ωo to determine the control frequency ω for matching the impedances.

The frequency limit value control section 10Bb is configured to control a frequency limit value, and determine a frequency limit value for defining an upper limit and a lower limit of a frequency range of a control frequency when the frequency control section 10Ba performs the impedance matching. The frequency limit value control section 10Bb limits an upper limit of an output command value created by the output limit value control section 10Ab to an output limit value, so as to control damage to the circuit elements of the high-frequency amplifier 3 caused by an excessive output command value output to the high-frequency amplifier 3.

(Drive Control Unit 10C)

The drive control unit 10C is configured to control amplification in the high-frequency amplifier 3 by using as output command values the output command value determined by the output control section 10Aa of the output control unit 10A and the control frequency ω determined by the frequency control section 10Ba of the impedance matching control unit 10B.

The output control unit 10A, the impedance matching control unit 10B and the drive control unit 10C do not necessarily consist of individual circuits, and may consist of DSPs. Furthermore, the control units 10A, 10B and 10C represent constituent elements for describing the control functions of the output control (FWD control, LOAD control), the output limit value control, the frequency control, the frequency limit value control and others, and the output limit value control and the frequency limit value control are not necessarily adapted to be performed respectively by the output control unit 10A and the impedance matching control unit 10B. For example, the output limit value control and the frequency limit value control may be adapted to be performed in conjunction with the frequency control by the impedance matching control unit 10B.

(Frequency Control and Frequency Limit Value Control)

The frequency control and the frequency limit value control will be described by referring to a flowchart shown in FIG. 5, and the frequency characteristics of the control shown in FIGS. 6 to 10.

In the flowchart described below, an output value is a general term for feedback values of forward power FWD, reflected power REF and an output voltage Vpp related to outputs of a high-frequency power supply device, as well as feedback values of a voltage and a current related to power outputs of the high-frequency power supply device.

In the flowchart of FIG. 5, the frequency control (S1, S2) and the frequency limit value control (FLV (Frequency Limit Value) control) (S11 to S19) are performed by parallel processing.

Now, the frequency control, the frequency limit value control (FLV (Frequency Limit Value) control) and the output limit value control will be described in order. FIGS. 6 and 7 illustrate the reflected power control (S2) in the frequency control, FIG. 8 illustrates the frequency limit value control (FLV (Frequency Limit Value) control), and FIGS. 9 and 10 illustrate the output limit value control.

(Frequency Control)

The frequency control is impedance matching control for changing an output frequency of a high-frequency power supply device to perform impedance matching on impedance fluctuation of a load, in which reflected power returning from the load to the high-frequency power supply device is reduced to supply power from the high-frequency power supply device to the load.

A matching unit provided between the high-frequency power supply device and the load is set to match impedances between the high-frequency power supply device and the load in a steady state. Furthermore, a high-frequency amplifier makes an operation frequency variable to thereby perform the impedance matching with respect to the impedance fluctuation of the load. When an output impedance of a power source is $Z_o$, a characteristic impedance of the matching unit including an impedance of the load is $Z_L$, and an input impedance on the load side viewed from the high-frequency power supply device is $Z_{in}$, a reflectivity coefficient Γ is expressed by $\tau=(Z_L-Z_o)/(Z_L+Z_o)$, and the impedances $Z_L$, $Z_o$, $Z_{in}$ as well as Γ are functions of a frequency ω. The high-frequency power supply device changes a frequency ω of a high frequency wave to be output with respect to the impedance fluctuation of the load to make each impedance variable, thereby performing the frequency control on the reflectivity coefficient Γ to be a minimum value.

In the impedance matching in which a frequency ω of a high frequency wave to be output is changed, the frequency control outputs a high frequency wave at a frequency for minimizing reflected power in two control steps of a phase control step (S1) at the start of the control and a reflected power control step (S2) after the start of the control. Retaining an acquisition of frequency control, and a reflectivity coefficient Γ and/or an amount of reflection Wr at the time are stored as minimum values (S3).

In addition to that, two control steps of the phase control step and the reflected power control step are repeated to maintain the reflected power in its minimum state. The phase control step of S1 and the reflected power control step of S2 perform the following control.

(Phase Control Step S1)

The phase control step is for defining a frequency-sweep direction for increasing or decreasing a frequency to be changed at the start of the control based on a phase state of a high-frequency power supply device.

The frequency-sweep direction is an increase/decrease direction of a frequency for decreasing a reflectivity coefficient and/or reflection amount in the frequency control. In the phase control step, the sweep direction in the frequency control is defined at the start of the control to thereby shorten a processing time of reducing reflected power in the frequency control.

The phase control step defines the frequency-sweep direction according to a state of a phase ϕ of the reflectivity coefficient Γ, i.e., positive phase or negative phase. The positive phase corresponds to a lagging load, and the negative phase corresponds to a leading load.

In the phase control step, a phase state is detected from a phase difference in phases between a voltage and a current at the output end of the high-frequency power supply device, or phases between a reflected wave and a forward wave at the output end of the high-frequency power supply device (S1a), and then a determination is made about whether the detected phase state is a positive phase or a negative phase (S1b).

When the phase state is the positive phase, it is determined as a lagging load, and thus the frequency sweep is performed to increase the frequency ω, thereby increasing the frequency ω with respect to an initial frequency ω(0) to define a frequency ω(1) (S1c). When the phase state is the negative phase, it is determined as a leading load, and thus the frequency sweep is performed to decrease the frequency ω, thereby decreasing the frequency ω with respect to the initial frequency ω(0) to define the frequency ω(1) (S1d).

In this way, the frequency is increased or decreased based on the frequency-sweep direction defined in the phase control step, so as to perform the reflected power control (S2). The reflected power control step shown in FIG. 5 presents a reflectivity coefficient Γ(k) of a frequency ω(k).

In the phase control S1, the relationship between the phase state and the frequency-sweep direction may be reversed depending on the state of the load. In such a case, the sweep direction is inverted in steps of S1e to S1h.

The frequency is changed in a sweep direction defined in the step of S1c or S1d to detect the reflectivity coefficient Γ or the reflected amount Wr (S1e), and the increase or decrease in the reflectivity coefficient Γ or the reflect amount Wr is determined (S1f). When the reflectivity coefficient Γ or the reflected amount Wr is increased, it is determined that the sweep direction was opposite and thus inversion control is performed to inverse the sweep direction of the frequency ω (S1g). On the other hand, when the reflectivity coefficient Γ or the reflected amount Wr is decreased, it is determined that the sweep direction was correct and thus the control is performed while maintaining the sweep direction of the frequency ω (S1h).

(Reflected Power Control Step S2)

The frequency control is intended for minimizing an absolute value |Γ| of the reflectivity coefficient Γ. However, the absolute value |Γ| of the reflectivity coefficient Γ is not always be minimized when the phase φ is zero degree. Thus, after starting the frequency sweep of the phase φ of the reflectivity coefficient Γ toward the zero degree in the phase control step, the reflected power control is performed to control the frequency such that the absolute value |Γ| of the reflectivity coefficient is minimized.

After the start of the frequency change in the sweep direction defined in the phase control step S1, the reflected power control step S2 controls continuation/discontinuation of change of frequency under the condition of control completion that the control of the reflectivity coefficient value and/or the reflected amount of the high-frequency power supply device is completed. In here, as a criterion of the control completion, the reflectivity coefficient and/or the reflected amount of the high-frequency power supply device is minimized by the control of the frequency change, so as to determine whether or not the reflectivity coefficient or the reflected amount is minimized.

When a starting point of the frequency control is in the positive phase, the frequency control for increasing a frequency is performed in the phase control step to shift the phase toward zero degree, and then the reflected power control is performed to obtain a frequency that makes the reflectivity coefficient Γ or the reflected amount to a minimum. When the starting point of the frequency control is in the negative phase, the frequency control for decreasing a frequency is performed in the phase control step to shift the phase toward zero degree, and then the reflected power control is performed to obtain a frequency that makes the reflectivity coefficient Γ or the reflected amount to a minimum.

In the reflected power control (S2) following the phase control step (S1), the frequency sweep is performed by changing the frequency ω(k) at timing (sampling) k (S2a), so as to obtain a reflectivity coefficient Γ(k) of a frequency ω(k) at timing k in each sampling (S2b).

Then, a reflectivity coefficient Γ(k−1) obtained at timing (k−1) is compared with the reflectivity coefficient Γ(k) obtained at the timing (k) (S2c). When a coefficient Γ(k) obtained by a later sampling (k) is smaller than a coefficient Γ(k−1) obtained by a sampling (k−1) which is one sampling before (Γ(k−1)≥Γ(k)), it is determined that the continuous frequency sweep can achieve smaller reflectivity coefficient Γ, so that the steps S2a and S2b will be repeated.

On the other hand, when the coefficient Γ(k) obtained by the later sampling (k) exceeds the coefficient Γ(k−1) obtained by the sampling (k−1) which is one sampling before (Γ(k−1)<Γ(k)), it is determined that the continuous frequency sweep increases the reflectivity coefficient Γ, and thereby the control is terminated by considering that the coefficient will be Γ(k+1)=Γ(k−1) in the next sampling (k+1) (S24).

(Recontrol Step)

The frequencies obtained in the phase control step and the reflected power control step are kept to thereby supply an output to the load. Then, if a fluctuation occurs on the load side or others, the impedance matching goes out of an appropriate state. In such a case, a recontrol step is performed to repeat the phase control step S1 and the reflected power control step S2, so as to determine an appropriate frequency ω again to perform the impedance matching. In the recontrol step, the reflectivity coefficients and the reflected amounts of the frequencies obtained in the phase control step and the reflected power control step are stored as minimum values, and when a reflectivity coefficient and a reflected amount obtained later exceed a threshold value, the recontrol is performed.

An example of transition of a n-control frequency in the reflected power control step S2 will be described based on examples of changes in frequency characteristics shown in FIG. 6. This figure illustrates an example in which an output command value is used as a load power command. The changes in frequency characteristics in FIG. 6 are shown in schematic form, and do not represent actual characteristics.

(a) Control Frequency ωo:

FIG. 6(a) shows a state where impedances are matched. In the impedance matched state, the high-frequency amplifier outputs high-frequency power at a reference frequency wo having smaller reflectivity coefficient Γ. Since the reflectivity coefficient Γ is small in the impedance matched state, a reflected power feedback value REF-FB gets lower, and a forward power command value FWD-CO becomes a value that can be regarded as substantially equivalent to a load power command value LOAD-CO, and thereby a forward power feedback value FWD-BF gets closer to the load power command value LOAD-CO (forward power command value FWD-CO). Hereinafter, the forward power and the forward power feedback value are indicated as FWD-FB, and the reflected power and the reflected power feedback value are indicated as REF-FB. Power (FWD-BF-REF−BF) obtained by subtracting the reflected power REF-FB from the forward power FWD-FB is load power that is effective power supplied effectively to a load.

(b) Control Frequency ωo:

FIG. 6(b) shows a situation in which impedances transit from a matched state to a mismatched state under the condition that a reference frequency wo is used as a control frequency. When the impedances move out the matched state due to load fluctuation or others and go into the mismatched state, the change in the frequency characteristics of the reflectivity coefficient Γ occurs, and thereby a frequency with minimum reflectivity coefficient Γ deviates from the reference frequency wo. FIG. 6(b) shows a situation where transition of a characteristic curve of the reflectivity coefficient Γ to a low frequency part occurs. When the reflectivity coefficient Γ of the reference frequency wo increases due to the transition of the reflectivity coefficient Γ, the reflected power REF-FB increases. As the reflected power REF-FB increases, the forward power feedback value FWD-FB increases. Then, the forward power feedback value FWD-FB exceeds a forward power threshold value, and the reflected power feedback value REF-FB exceeds a reflected power threshold value.

(c) Control Frequency ω1:

The frequency control changes the control frequency from the reference frequency wo to a control frequency ω1. FIG. 6(c) shows a frequency control state of the control frequency ω1. A reflectivity coefficient Γ of the control frequency ω1 becomes smaller than the reflectivity coefficient Γ of the reference frequency wo, resulting in the decrease in the reflected power REF-FB decreases.

The forward power feedback value FWD-FB decreases in connection with the decrease in the reflected power REF-FB.

In the state shown in FIG. 6(c), the forward power feedback value FWD-FB still exceeds the forward power threshold value, and the reflected power feedback value REF-FB still exceeds the reflected power threshold value.

(d) Control Frequency ω2:

The frequency control allows the control frequency to change from the reference frequency ω1 to the control frequency ω2. FIG. 6(d) shows a state of the frequency control of the control frequency ω2. The reflectivity coefficient Γ of the control frequency ω2 further gets smaller than the reflectivity coefficient Γ of the reference frequency ω1, and the reflected power feedback value REF-FB also decreases. In addition, the forward power feedback value FWD-FB further decreases in connection with the decrease in the reflected power feedback value REF-FB. In the state shown in FIG. 6(d), the reflected power feedback value REF-FB decreases to a minimum.

FIG. 7 schematically shows steps S2a to S2d in the reflected power control (S2).

In Step S2c, a comparison is made between a reflectivity coefficient Γ(k−1) and a reflectivity coefficient Γ(k), which are obtained at different timings of sampling, and when a coefficient Γ(k) obtained in a later sampling (k) exceeds a coefficient Γ(k−1) obtained in the previous sampling (k−1) (Γ(k−1)<Γ(k)), it is determined that the reflectivity coefficient Γ will increase if the frequency sweep is continued, and thus the control is terminated in Step S2d by defining that Γ(k+1)=Γ(k−1) in the next sampling (k+1). In the vicinity of a tuning frequency shown in FIG. 7, a return point of the frequency represents Step Std.

(Frequency Limit Value Control)

Next, a description will be made about frequency limit value control (FLV control). The description will be made below by referring to the flowchart in FIG. 5 and explanatory charts in FIG. 8.

In the output control, a determination is made about whether or not it is in an output limit state where an upper limit of an output command value is limited. When the forward power control is applied as the output control to make the determination about the output limit state, a forward power feedback value (FWD-FB) is compared with a forward power limit value (FWD-Limit) to determine whether it is in a forward power limit state (FWD limit state) or not. When the load power control is applied as the output control, a load power feedback value (LOAD-FB) calculated by subtracting a reflected power feedback value (REF-FB) from a forward power feedback value (FWD-FB) is compared with a load power limit value (LOAD-Limit) to determine whether it is in a load power limit state (LOAD limit state) or not (S11).

When it is in the output limit state, a control frequency ω is shifted toward a reference frequency ωo to update the frequency limit value control (S12), so that the output limit state is eliminated and the state is reset, and a control frequency at this time is stored as a frequency ωs (S13). Then, a control frequency ±ωs is set as a frequency limit value ±ωLimit (S14).

On the other hand, when it is not in the output limit state, a frequency limit value ωLimit is set according to an output state (S15 to S19). An output value is obtained from the high-frequency power supply device according to the output limit state. As an output value, a feedback value selected from a forward power feedback value FWD−FB, a reflected power feedback value REF−FB, an output voltage feedback value Vpp−FB, feedback values Vdc−FB, Ido−FB respectively of an output voltage and an output current of a DC power source, and a load power feedback value (LOAD−FB) can be used (S15).

The obtained output value is compared with an output value obtained in the last frequency limit value control, and an amount of output change Δ of a difference obtained by the comparison is calculated (S16), thereby comparing the amount with a predetermined threshold value. The threshold value is a value to be set for determining whether there is a fluctuation in the output value and can be set based on a hysteresis predictable in a state where impedances are matched (S17).

In the step of comparing the amount of output change Δ of the output value with the threshold value, when the amount of output change Δ does not exceed the threshold value, a control frequency is kept without setting a frequency limit value. On the other hand, when the amount of output change Δ exceeds the threshold value, the frequency limit value is set with respect to the control frequency ω. The frequency limit value is set by replacing the frequency limit value ωLimit with a predetermined default value ωmax (S18), and the default value ωmax is used to set the frequency limit value ±ωLimit (S19). In the step of comparing the amount of output change Δ with the threshold value in S17, if the amount of output change Δ is equal to the threshold value, the frequency limit value may or may not be set.

FIG. 8 illustrates the frequency limit value control, in which FIG. 8(a) shows a case where forward power is in a limited state in Step S11, and FIG. 8(b) shows a case where the forward power is not in the limited state in Step S11.

When the forward power is in the limited state:

In FIG. 8(a), a crosshatched frequency range represents a region where the forward power is in the limited state. When the forward power is in the limited state, an output frequency ω is shifted inwardly (S12) to thereby eliminate the limit state of the forward power, and a frequency ωs at this time becomes a frequency limit value ωLimit (S13, S14).

When the forward power is not in the limited state:

In FIG. 8(b), a crosshatched frequency range represents a region where the forward power is not in the limited state. When the forward power is not in the limited state, the frequency limit value ωLimit is replaced with a predetermined maximum frequency ωmax (S18), and the frequency ωmax becomes the frequency limit value ωLimit (S19).

In the frequency control, the frequency ω for performing the reflected power control is in the frequency range of the frequency limit value ±ωLimit set by the frequency limit value.

On the other hand, the output control (FWD control, LOAD control), performed separately from the frequency control, is performed within the bounds of output limit values (FWD limit value, LOAD limit value) set by the output limit value control (FWD limit value control, LOAD limit value control) (S20).

Operation Examples of Frequency Limit Value Control, Output Limit Value Control and Output Control Operation examples of the frequency limit value control, the output limit value control and the output control will be described based on changes in frequency characteristics illustrated in FIGS. 9 and 10. These figures illustrate the frequency limit value control and the output limit value control, provided that the output control is performed by using an output command value as a load power command value and a forward power value as an output value, are illustrated. It is to be noted that FIGS. 9 and 10 schematically show the frequency characteristic changes, and do not show actual characteristic changes.

FIGS. 9(A) and 9(B) show cases where impedances are in a matched state at a reference frequency ωo, and FIGS. 10(A) and 10(B) show cases where the impedances are in a mismatched state at the reference frequency ωo. In here, FIGS. 9 and 10 indicate a forward power feedback value FWD-FB with "x", a reflected power feedback value REF-FB with "○", a control value with "Δ", and a forward power limit value FWD-Limit with a broken line.

When impedances are matched:

In FIGS. 9(A), 9(B) showing the impedance matched states, FIG. 9(A) shows a case where an output value is larger than a forward power limit value, and FIG. 9(B) shows a case where the output value is less than the forward power limit value. The frequency characteristics of the forward power limit value shown in FIGS. 9(A) and 9(B) exemplify that the forward power limit values FWD-Limit are set to be equal in a frequency range [ω−, ω+] which is defined by a frequency limit value, and the forward power limit values FWD-Limit denoted with the broken line have the same values over the entire frequency range [ω−, ω+].

(A) Forward Power Value>Power Limit Value:

(A1) presents a state where a forward power value as an output value exceeds a forward power limit value. When forward power FWD-FB is larger than a forward power limit value FWD-Limit, the output (forward power (FWD)) limit value control applies the forward power limit value FWD-Limit as a control value to thereby impose a limit on the control value.

(A2) presents a state where the control value is limited to the forward power limit value FWD-Limit. The control value is limited to the forward power limit value FWD-Limit denoted with the broken line over the entire frequency range [ω−, ω+].

(A3) presents a condition of the output control (forward power control) performed based on the control value limited to the forward power limit value FWD-Limit.

By performing the output control based on the control value obtained by the forward power (FWD) limit control, a reflected power feedback value REF-FB is kept below a reflected power threshold value. The illustrated forward power feedback value FWD-FB and the reflected power feedback value REF-FB are examples that are subjected to the output control based on the control value limited to the frequency limit value obtained by the frequency limit value control and the forward power limit value obtained by the forward power limit value control, respectively.

(B) Forward Power≤Forward Power Limit Value:

(B1) presents a state where the forward power value as the output value is equal to or lower than the forward power limit value. In the examples of (B), as with the examples of (A), the forward power limit values FWD-Limit denoted with the broken line are set to the same value over the entire frequency range [ω−, ω+] defined by the frequency limit value.

(B2) presents a control condition based on a control value that is not limited by a forward power limit value. When the forward power FWD-FB is smaller than the forward power limit value FWD-Limit, the output (forward power (FWD)) limit value control does not need to impose a limit on the control value. The control value is defined based on a load power command value LOAD-CO.

(B3) presents a state of the output control (forward power control) performed based on the control value. In the output control, since the output value performed based on the control value obtained by the load power command value LOAD-CO is below the forward power limit value FWD-Limit, the output control is performed based on the control value to keep the reflected power feedback value REF-FB below the reflected power threshold value.

The illustrated forward power feedback value FWD-FB and the reflected power feedback value REF-FB are examples that are subjected to the output control based on the control value. In the above-described comparison between the forward power value and the forward power limit value, if both values are equal to each other, the control may be performed according to either one of (A) or (B).

When impedances are not matched:

FIGS. 10(A) and 10(B) showing the states where the impedances are not matched illustrate cases where forward power values are larger than a forward power limit value. FIG. 10(A) shows an example of flat frequency characteristics in which the forward power limit values are set to the same value in a frequency range, and FIG. 10(B) shows an example of frequency characteristics having slope characteristics in which the forward power limit values are set to different values in a frequency range that is broader than the frequency range in FIG. 10(A).

The frequency characteristics of the forward power and the reflected power in FIG. 10 present examples that a reference frequency ωo is not minimized due to the impedance mismatching, but slopes from high frequency toward low frequency.

In the impedance mismatched state, a reflectivity coefficient Γ is off the impedance matched state, and the minimum value of the reflectivity coefficient Γ deviates from the reference frequency ωo in the impedances matched state. Consequently, the reflected power feedback value REF-FB exceeds the reflected power threshold value.

(A) Forward Power Value>Forward Power Limit Value:

A forward power limit value FWDlimit denoted with a broken line is an example of the frequency characteristics in which the forward power limit values FWDlimit are set to the same value over the entire frequency range [ω−, ω+] for which the forward power limit values are set.

(A1) presents a state where a forward power value as an output value exceeds a forward power limit value. When forward power FWD-FB is larger than a forward power limit value FWD-Limit, the output (forward power (FWD)) limit value control applies the forward power limit value FWD-Limit as a control value to thereby impose a limit on the control value.

(A2) presents a state where the control value is limited to the forward power limit value FWD-Limit. The control value is limited to the forward power limit value FWD-Limit denoted with the broken line over the entire frequency range [ω−, ω+].

(A3) presents a condition of the output control (forward power control) performed based on the control value limited to the forward power limit value FWD-Limit. By performing the output control based on the control value obtained by the forward power (FWD) limit control, a reflected power feedback value REF-FB decreases in a direction falling below a reflected power threshold value, so as to be kept below the reflected power threshold value. The illustrated forward power feedback value FWD-FB and the reflected power feedback value REF-FB are examples that are subjected to the output control based on the control value limited to the frequency limit value obtained by the frequency limit value control and the forward power limit value obtained by the forward power limit value control.

(B) Forward power limit value having non-flat frequency characteristics:

In order to perform the output limit value control in a broad frequency range, a forward power limit value is set to be large with respect to a frequency in the vicinity of a reference frequency ωo and a forward power limit value is set to be small with respect to a frequency having a large deviation from the reference frequency ωo so that the forward power limit value has non-flat frequency characteristics. The non-flat frequency characteristics of the examples in (B) illustrate frequency characteristics having slope characteristics in which the forward power limit values are set to different values in the frequency range broader than the frequency range in the examples in (A), and the forward power limit values denoted with the broken lines are the same in the vicinity of the reference frequency ωo in the frequency range [ω−, ω+] of the forward power limit value, whereas the forward power limit values decrease toward ω−, ω+ on the outside of the reference frequency ωo.

(B1) presents a state where the forward power value as the output value exceeds the forward power limit value. When the forward power FWD-FB is larger than the forward power limit value FWD-Limit, the output (forward power (FWD)) limit value control applies the forward power limit value FWD-Limit as a control value to thereby impose a limit on the control value.

Since the frequency characteristics shown in (B1) has a broad frequency range, the reflected power REF-FB exceeds a reflected power threshold value, denoted with a dashed-dotted line, that may cause the generation of excessive reflected power. In (B1), the reflected power REF-FB exceeds the reflected power threshold value in a high-frequency range.

(B2) presents a state where the output value is limited to the forward power limit value FWD-Limit. The output value is limited to the forward power limit value FWD-Limit denoted with the broken line over the entire frequency range [ω−, ω+]. In (B2), the control value is limited to the forward power limit value FWD-Limit denoted with the broken line over the entire frequency range [ω−, ω+]. In the frequency range [ω−, ω+], a forward power limit value FWD-Limit on the end of the frequency is set to be lower than a forward power limit value FWD−Limit near a reference frequency ωo on the center part of the frequency. In the example shown in (B2), the forward power limit value FWD−Limit is set to a predetermined value in the vicinity of the reference frequency ωo, so as to gradually decrease toward the end of the frequency.

The forward power limit value FWD−Limit is set to a small value on the end of the frequency in the frequency range and to a large value at the center of the frequency in the frequency range. To the forward power limit value FWD-Limit set at the center of the frequency, the forward power limit value FWD−Limit set according to the flat frequency characteristics shown in (A) can be applied. The maximum value of the forward power limit value FWD−Limit can be a value obtained by adding a predetermined margin to a rated value of the high-frequency power supply device, by way of example. For example, the margin can be set randomly according to the usage conditions of the high-frequency power supply device, such as a value endurable to excessive power supply for a short time.

(B3) presents a state of the output control (forward power control) performed based on the control value that is limited to the forward power limit value FWD−Limit.

The control value for performing the frequency control is performed based on the control value limited to the forward power limit value FWD−Limit by the frequency limit value control and the forward power limit value control (FWD limit control). By performing the frequency control based on the control value obtained by the frequency limit value control and the forward power limit value control (FWD limit control), the reflected power feedback value REF−FB decreases in a direction that is below the reflected power threshold value.

The forward power limit value is provided with the non-flat frequency characteristics in the frequency control, so that the control value is more limited on the end of the frequency than at the center of the frequency. By setting a large control amount of the forward power limit value on the end of the frequency, a control value at a control frequency deviating significantly from the reference frequency is considerably limited to decrease the control value, thereby controlling the reflected power feedback value REF−FB and expanding the frequency range in the limit control.

By setting the large control amount for the forward power limit value control on the end of the frequency to hold down the control amount of the forward power, the reflected power feedback value REF−FB can be kept below the reflected power threshold value even when the frequency range in (B) is set to be broader than the frequency range in (A).

<Example of Frequency Limit Value Control>

Figure 11:
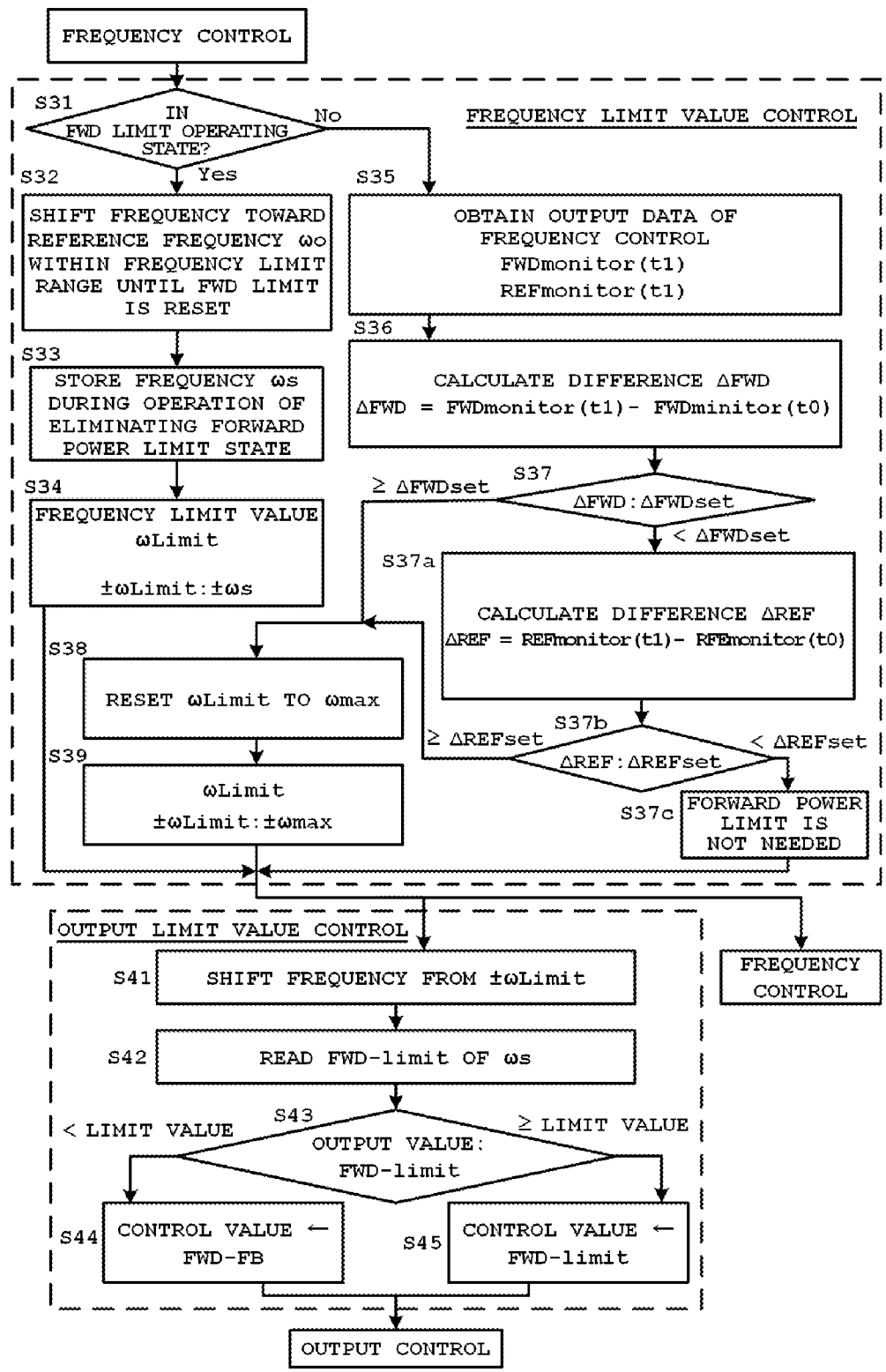
FIG. 11 shows flowcharts of the frequency limit value control and limit value control.
Figure 12:
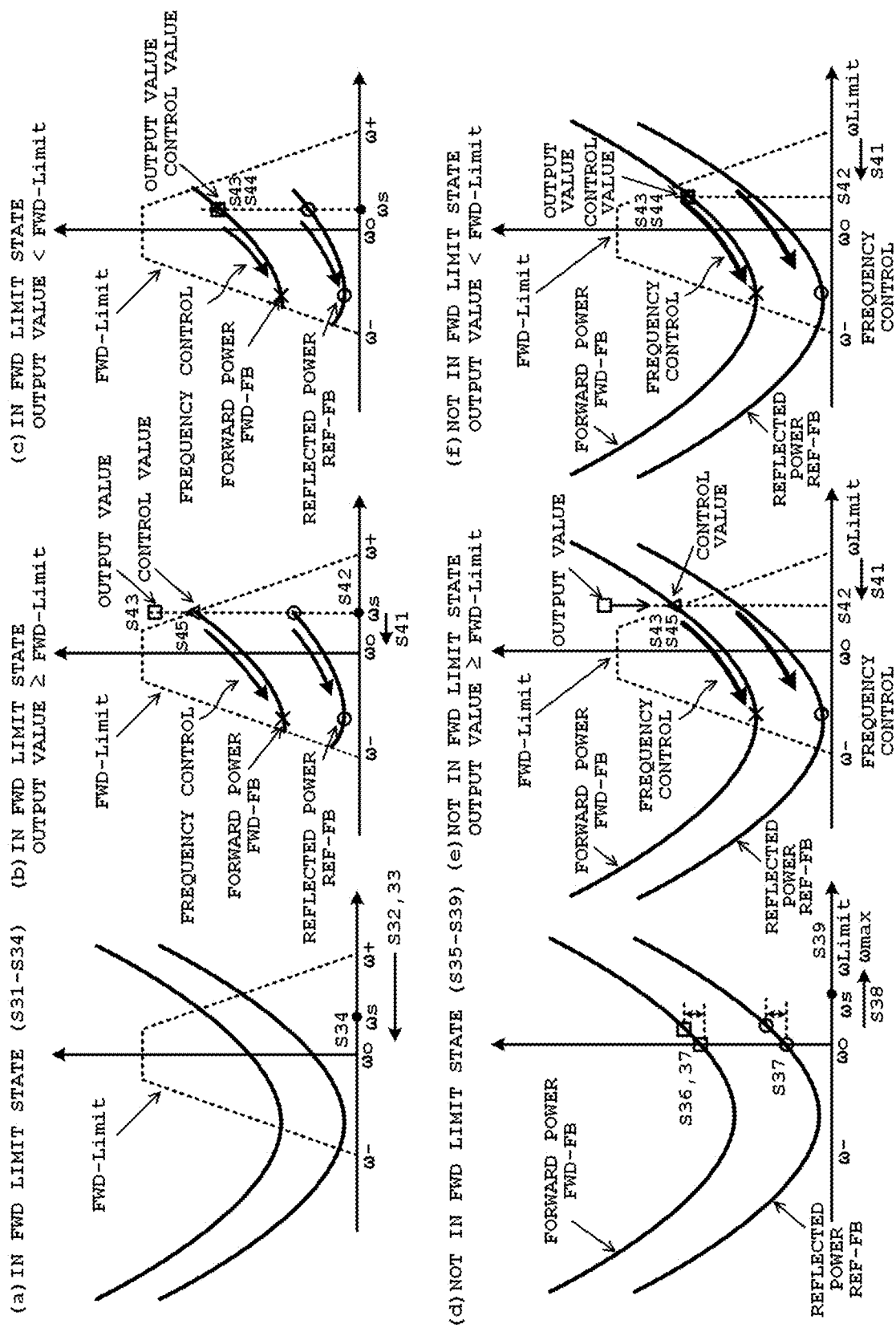
FIG. 12 is a diagram showing frequency characteristics illustrating steps of the flowcharts in FIG. 10.

A description will now be made about control as the frequency limit value control, in which an output command is a load power command, by referring to a flowchart in FIG. 11 and a diagram showing a power state in the forward power limit value control in FIG. 12. These figures illustrate the output control by the forward power control based on a load power command value. The flowchart in FIG. 11 shows in Steps S31 to S39 the frequency limit value control that corresponds to the frequency limit value control in Steps S11 to S20 shown in the flowchart in FIG. 5. Furthermore, the flowchart in FIG. 11 shows in Steps S41 to S45 the FWD limit value control that corresponds to the frequency limit value control in Step S20 shown in the flowchart in FIG. 5.

In the output limit value control using a load power command as an output command, a determination is made about a FWD limit state that indicates whether or not a forward power limit value is set for a control value. Since load power is obtained by subtracting reflected power from forward power, when a forward power command value is set, the forward power limit value can be obtained as a command value based on a load power command value obtained by subtracting the reflected power from the forward power (S31).

(FWD Limit State)

When a frequency is in a FWD limit state where the forward power limit value is set, the frequency in the FWD limit state is shifted toward a reference frequency ωo in a frequency range until the setting of the forward power limit value is reset (S32), so as to eliminate the forward power limit state and store an operating frequency ωs (S33) (see FIG. 12(a), S32, S33). The stored frequency ωs is set as a frequency limit value ωLimit. Thus, a frequency range [−ωLimit, +ωLimit] is set (S34) (see FIG. 12(a), S34). Then, after the frequency control and the FWD limit value control are performed, the process goes back to the FWD control.

(State where FWD is not Limited)

When it is determined in Step S31 that the frequency is not in an FWD limit operating state, Steps S35 to S39 are performed to set the frequency limit value ωLimit.

Output data of the frequency control is obtained. In here, a forward power feedback value FWD-FB and a reflected power feedback value REF-FB detected by a high-frequency sensor are used to derive a monitor value FWDmonitor(t1) and a monitor value REFmonitor(t1). These monitor values are values at respective detection times (t1) (S35). On the basis of a difference ΔFWD between a forward power monitor value FWDmonitor(t1) currently derived and a forward power monitor value FWDmonitor(t0) previously derived at a detection time (t0) (=FWDmonitor(t1)−FWDmonitor(t0)), an amount of change in the forward power is calculated (S36) (see FIG. 12(d), S36).

Then, a determination is made about a fluctuation state of the difference ΔFWD, which is the amount of change in the forward power monitor value FWDmonitor derived in Step S36. The determination about the fluctuation state can be made by comparing the difference ΔFWD with a threshold value ΔFWDset. For example, the threshold value ΔFWDset can be defined based on a hysteresis of the difference ΔFWD (S37) (see FIG. 12(d), S37).

In the determination made in Step S37, when the difference ΔFWD is larger than the threshold value ΔFWDset, it is determined that there is fluctuation of the difference that exceeds the hysteresis of the forward power feedback value FWD-FB that leads to a change in the matching state of the impedances, and the frequency limit value ωLimit is reset to a default value ωmax (S38), and then the frequency limit value ±ωLimit is set based on the default value ωmax (S39). Subsequently, the frequency control and the FWD limit value control are performed, and then the process goes back to the FWD control.

On the other hand, when the difference ΔFWD is below the threshold value ΔFWDset in the determination made in Step S37, there is no fluctuation in the forward power feedback value FWD-FB. Even if there is a fluctuation in the forward power feedback value FWD-FB, it is determined that the amount of fluctuation is below the hysteresis, and corresponding determination is subsequently made about the fluctuation in the reflected power REF.

Calculation is performed to obtain a difference ΔREF (=REFmonitor(t1)−REFmonitor(t0)) that is an amount of change between a derived reflected power monitor value REFmonitor(t1) and a reflected power monitor value REFmonitor(t0) derived at a previous detection time (t0) (S37a) (see FIG. 12(d), S37).

Then, a determination is made about a fluctuation state of the difference ΔREF that is an amount of temporal change in the reflected power monitor value REFmonitor derived in Step S37a. The determination can be made by comparing the difference ΔREF with the threshold value ΔREFset. The threshold value ΔREFset can be defined based on the hysteresis of the difference ΔREF, for instance (S37b) (see FIG. 12(d), S37).

In the determination made in Step S37b, when the difference ΔREF is larger than the threshold value ΔREFset, there is a fluctuation that exceeds the hysteresis of the reflected power REF−FB, and thus it is determined that there is a change in the matching state of the impedances, thereby setting the frequency limit value ωLimit in Step S38 or later.

In the determination made in Step S37b, when the difference ΔREF is below the threshold value ΔREFset, it is determined that there is no fluctuation in the reflected power REF−FB or, even when there is a fluctuation in the reflected power REF−FB, the fluctuation is below the hysteresis, and thus it is determined that no forward power limit value control is necessary, and the process goes back to the FWD control after the frequency control and the FWD limit value control (S37c).

(Output Limit Value Control (FWD Limit Value Control))

The control for setting the output limit value control (FWD limit value (forward power limit value)) in Steps S41 to S45. The control frequency shifts from the frequency ±ωLimit on the high frequency end in the frequency range. The shift of the control frequency can be selected from a shift from the high frequency end +ωLimit toward a low frequency part in the frequency range and a shift from the low frequency end −ωLimit toward a high frequency part in the frequency range (S41) (see FIGS. 12(b), 12(e), S41). In the shift of the control frequency, a forward power limit value FWD-limit set with respect to a frequency ωs during the shift is read out (S42) (see FIG. 12(b), S42).

The output command value is compared with the forward power limit value FWD−Limit read out in Step S42 (S43). In the comparison in Step S43, when the output command value is below the forward power limit value FWD−Limit, the limitation by the forward power limit value is not required, and thus the output command value is used as a control value (S44) (see FIG. 12(b), S44). On the other hand, when the output command value is more than the forward power limit value FWD-limit, the forward power limit value FWD−Limit is used as the control value to limit the upper limit of the output command value in order to perform the limitation by the forward power limit value (S45) (see FIGS. 12(b), 12(e), S45).

(Frequency Control)

FIGS. 12(b), 12(c) and FIGS. 12(e), 12(f) respectively show the frequency control and the limit control in the FWD limit state and not in the FWD limit state. When a frequency is in the FWD limit state, FIG. 12(b) shows a case where the output value the forward power limit value FWD−Limit, and FIG. 12(c) shows a case where the output value<the forward power limit value FWD-Limit. In addition to that, when the frequency is not in the FWD limit state, FIG. 12(e) shows a case where the output value the forward power limit value FWD-Limit, and FIG. 12(f) shows a case where output value<the forward power limit value FWD-Limit.

When the frequency is in the FWD limit state:

FIG. 12(b) shows an example of the frequency control when the frequency is in the FWD limit state and the output value is equal to or larger than the forward power limit value FWD-Limit. The frequency limit value ωs derived in Step S34 is used to perform the frequency control. Since the output value at the frequency ωs exceeds the forward power limit value FWD-Limit (S43), the forward power limit value FWD-Limit is used as a limit value to perform the output control (S45).

FIG. 12(c) shows an example of the frequency control when the frequency is in the FWD limit state and the output value is smaller than the forward power limit value FWD-Limit. In the FWD limit state, the frequency control is performed with the frequency limit value ωs derived in Step S34. Since the output value at the frequency ωs does not exceed the forward power limit value FWD-Limit (S43), the output control is performed without imposing a limit by the forward power limit value FWD-Limit (S44).

When the frequency is not in the FWD limit state:

FIG. 12(e) shows an example of the frequency control when the frequency is not in the FWD limit state and the output value is equal to or larger than the forward power limit value FWD-Limit. The frequency control is performed with the frequency limit value ωmax derived in Step S39. Since the output value obtained in the frequency control exceeds the forward power limit value FWD-Limit (S43), the output control is performed by using the forward power limit value FWD-Limit as a limit value (S45).

FIG. 12(f) shows an example of the frequency control when the frequency is not in the FWD limit state and the output value is smaller than the forward power limit value FWD-Limit. The frequency control is performed with the frequency limit value ωs derived in Step S39. Since the output value obtained in the frequency control does not exceed the forward power limit value FWD-Limit (S43), the output control is performed without imposing a limit by the forward power limit value FWD-Limit (S44).

<Switching Between FWD Limit Value Control and REF Limit Value Control>

A description will now be made about the switching between the FWD limit value control and the REF limit value control by referring to FIG. 13.

When the output value is larger than the forward power limit value FWD-Limit, the FWD limit value control is employed to perform the output control by using the forward power limit value FWD-Limit as a control value.

Even when the forward power limit value FWD-Limit is used as the control value by the FWD limit value control, if the reflected power is larger than the reflected power limit value REF-Limit, the REF limit value control is employed to perform the output control by using the reflected power limit value REF-Limit as the output value instead of the forward power limit value FWD-Limit. By switching from the FWD limit value control to the REF limit value control, damage to the circuit elements caused by the excessive reflected power can be prevented.

FIGS. 13(a) and 13(b) show frequency characteristics in a state of switching between the FWD limit value control and the REF limit value control and a flowchart of the switching, respectively.

In FIG. 13(a), the reflected power REF-FB has a value that does not exceed the reflected power limit value REF-Limit in a range of a frequency lower than the frequency denoted with a dashed-dotted line, so that a control value limited to the forward power limit value is used to perform the output limit value control. On the other hand, since the reflected power REF-FB has a value that exceeds the reflected power limit value REF-Limit in a range of a frequency higher than the frequency denoted with the dashed-dotted line, a control value limited to the reflected power limit value is used to perform the reflected power limit value control.

In Step S41, the frequency is shifted from the value ±ωLimit, and after the forward power limit value at the frequency ωs is read out in Step S42, a comparison is made between a load power command value LOAD-CO and a load power limit value LOAD-Limit (S51).

In Step S51, when the load power command value LOAD-CO is less than the load power limit value LOAD-Limit, a control value is set in Step S43 or later. When the load power command value LOAD-CO is larger than the load power limit value LOAD-Limit in Step S51, a comparison is made between the reflected power feedback value REF-FB and the reflected power limit value REF-Limit (S52).

In Step S52, when the reflected power feedback value REF-FB is less than the reflected power limit value REF-Limit, a control value is set in Step S43 or later. When the reflected power feedback value REF-FB is larger than the reflected power limit value REF-Limit, the reflected power limit value REF-Limit is set as the output value (S53).

<Switching of Load Power Command Value>

A description will now be made about some control examples in which a load power command value is switched with reference to FIGS. 14 to 18. In here, three examples of the switching will be presented. Switching example 1 is for switching from low load power to high load power. Switching examples 2 and 3 are for switching from the high load power to the low load power. The switching examples 2 and 3 show different frequencies for starting the control. In this connection, the magnitude of the high power and the low power is representation for comparing the magnitude of the power, and does not specify an absolute value of a power value. The examples shown in the figures set the low power to 200 W and the high power to 600 W. In FIGS. 14, 17 and 18, a unit % Freq shown on a horizontal axis expresses a degree of the deviation from a reference frequency, in which the reference frequency is set to 0% Freq, and frequencies that deviate from the reference frequency are presented with % with respect to the reference frequency.

In FIGS. 14 to 18, output characteristics of the load power of 200 W is denoted with P1 and output characteristics of the load power of 600 W is denoted with P2. In these figures, an FWD(P1) denotes forward power characteristics of the output characteristics P1, an FWD(P2) denotes forward power characteristics of the output characteristics P2, an REF(P1) denotes reflected power characteristics of the output characteristics of P1, an REF(P2) denotes reflected power characteristics of the output characteristics of P2, an FWDLimit denotes a forward power limit value, and an REFLimit denotes a reflected power limit value.

Switching Example 1

FIGS. 14 to 16 show a switching example 1. The switching example 1 is for switching a load recipe 1 to a load recipe 2, and the load recipe 1 is controlled in the order of circled number 1 to circled number 3 in FIG. 14, then the load recipe P1 is switched to the load recipe P2 in the circled number 4, and the load recipe P2 is controlled in the order of circled number 5 to the circled number 7.

A flowchart in FIG. 16 shows that the frequency control is started according to the load recipe P1 of the load power of 200 W (S100). The frequency control changes a frequency in a direction where reflected power decreases (S101).

A determination is made about whether or not the reflected power has reached a minimum value (S102). If the reflected power has reached the minimum value, the frequency control according to the load recipe P1 is terminated (S104). In the case where the forward power FWD has reached the forward power limit value FWD-Limit before the reflected power reaches the minimum value (S103), the frequency control according to the load recipe P1 is also terminated (S104).

After the termination of the frequency control according to the load recipe P1, if the load recipe is needed to be changed (S105), the load recipe is switched from recipe P1 to recipe P2 (S106).

In the load recipe P2, the frequency control changes a frequency in a direction where the reflected power decreases (S107).

Then, a determination is made about whether or not the reflected power has reached the minimum value (S108). If the reflected power has reached the minimum value, the frequency control according to the load recipe P2 is terminated (S110). In the case of where the forward power FWD has reached the forward power limit value FWD-Limit before the reflected power reaches the minimum value (S109), the frequency control according to the load recipe P1 is also terminated (S110).

FIGS. 15(a), 15(b), 15(c) and 15(d) show temporal changes of load power (LOAD power), a forward power feedback value (FWD-FB), a reflected power feedback value (REF-FB), and a frequency ω, respectively. The circled numbers 1 to 7 shown in FIGS. 14 and 15 represents the same output state.

In the frequency control according to the load recipe P1, the frequency control is terminated when the frequency changes to a level where the forward power feedback value FWD-FB exceeds the forward power limit value FWD-Limit, and then the load recipe is switched to the recipe P2. The switching to the load recipe P2 is started from a frequency at which the forward power feedback value FWD-FB in the load recipe P2 is equal to or less than the forward power limit value FWD-Limit.

Switching Example 2

FIG. 17 shows a switching example 2. The switching example 2 is for switching from the load recipe 2 to the load recipe 1, and the load recipe 2 is controlled in the order of circled number 1 to circled number 2, then the load recipe P2 is switched to the load recipe P1 between the circled number 2 and the circled number 3, and the load recipe P1 is controlled in the order of circled number 3 to the circled number 5. A frequency for starting the control in the switching example 2 is the same as the example of the starting frequency in the switching example 1.

Switching Example 3

FIG. 18 shows a switching example 3. The switching example 3 is for switching from the load recipe P2 to the load recipe P1 which is the same as the switching example 2, except that a frequency for starting control is different. In the switching example 2, the load recipe P2 performs the control in the order of the circled number 1 to the circled number 4, the load recipe P2 is switched to the load recipe P1 between the circled number 4 and the circled number 5, and the load recipe P1 performs the control in the order of the circled number 5 to the circled number 7.

In the switching example 3, the forward power feedback value FWD-FB at the start of the control shown in the circled number 1 is larger than the forward power limit value FWD-Limit, so that the frequency control is started at the point of the circled number 2 where the characteristics of the forward power feedback value FWD-FB intersects with the forward power limit value FWD-Limit.

Detailed Configuration Example

A description will be made about a detailed configuration example of a high-frequency power supply device of the present invention based on FIG. 19. A high-frequency power supply device 1 includes a DC power source 2, a high-frequency amplifier 3, a transformer 7, a high-frequency filter 8, a high-frequency sensor 4, a matching unit 5 and a controller 10, and is configured to supply an output to a load 6.

The DC power source 2 is a power supply source for supplying DC power to the high-frequency amplifier 3. The high-frequency amplifier 3 is configured to convert the DC power supplied from the DC power source 2 into high frequency waves and perform amplification control based on a control value of the controller 10, thereby controlling a frequency and an output. The transformer 7 is configured to transform a high frequency voltage in the high-frequency amplifier 3 into a voltage having a value corresponding to a load 6. The high-frequency filter 8 is configured to perform filtering on a high frequency wave of the output from the transformer 7 to thereby output a frequency component required by the load 6.

The high-frequency sensor 4 is configured to detect forward power FWD flowing from the high-frequency power supply device 1 toward the load 6 and reflected power REF reflected by the load 6 and returning to the high-frequency power supply device 1, and to feed back a feedback value FWD-FB of the detected forward power and a feedback value REF-FB of the detected reflected power to the controller 10. In the high-frequency sensor 4, separation between the forward power FWD and the reflected power REF can be performed by using, for instance, a directional coupler, not shown.

The matching unit 5 is configured to match impedances between the high-frequency power supply device 1 and the load 6. The impedance matching by the matching unit 5 is performed to match an impedance of the high-frequency power supply device 1 during rated output and an impedance of the load 6 in a steady state. An output voltage Vpp of the high-frequency power supply device 1 is detected by an output voltage on the output end of the matching unit 5, and a detected feedback value Vpp-FB is fed back to the controller 10. The output voltage Vpp is a peak-to-peak voltage between positive and negative peak values of the output voltage.

The controller 10 includes an output control unit 10AA, a limit control unit 10AB and a drive control unit 10C. The output control unit 10AA is configured to include the output control section 10Aa and the frequency control section 10Ba shown in the diagram of FIG. 4. In addition to that, the limit control unit 10AB is configured to include the output limit value control section 10Ab and the frequency limit value control section 10Bb shown in the diagram of FIG. 4. The drive control unit 10C is configured to receive a control value regarding the output control from the output control section 10Aa and a control value regarding the frequency control in the frequency control section 10Ba as an output command value, thereby controlling the high-frequency amplifier 3. The controller 10 performs the output control (FWD control) and the frequency control separately.

In the controller 10, a controlling section corresponding to the frequency control section 10Ba performs the frequency control based on an output command value (forward power command value 10a) and feedback signals (forward power feedback value FWD-FB and reflected power feedback value REF-FB), so as to derive a control frequency for performing the impedance matching between the high-frequency power supply device 1 and the load 6. A controlling section corresponding to the output control section 10Aa performs the output control by the FWD control or LOAD control based on the output command value (forward power command value 10a) and the feedback signals (forward power feedback value FWD-FB and the reflected power feedback value REF-FB). This output control uses the control frequency derived by an impedance matching control unit 10B while using an output limit value defined in a frequency range of the control frequency to keep the output within limited power. In the case where the output control is performed with the forward power, an FWD limit value defined in a frequency range defined by the frequency limit value control is used.

In the output control unit 10AA, a switch 10Aa-2 is used to change the control between the forward power control based on a forward power command value 10a and the load power control based on a load power command value (LOAD power command value) 10b. The load power control uses a value calculated with a calculation section 10Aa-1 by subtracting the reflected power feedback value REF-FB from the forward power feedback value FWD-FB as a load power feedback value LOAD-FB.

The limit control unit 10AB is configured to perform the frequency limit value control to limit the frequency range of the control frequency, and perform the forward power limit value control (FWD limit value control) to limit an upper limit of the output command value in the control frequency to the forward power limit value (FWD limit value).

The limit control unit 10AB has the following limit values: a forward power limit value 10d for limiting the forward power command value, a reflected power limit value 10e for limiting the reflected power command value, an output voltage limit value 10c for limiting the output voltage Vpp, a direct-current (DC) voltage limit value 10f for limiting a voltage in the DC power source, a direct current (DC) limit value 10g for limiting a current in the DC power source, and a loss (LOSS) power limit value 10h for limiting loss power. Furthermore, the output control unit 10AA has the forward power command value 10a equivalent to a target value of the forward power output by the high-frequency power supply device, and the load power command value (LOAD power command value) 10b equivalent to a target value of the load power.

These limit values may be stored in a memory included in the limit control unit 10AB, or may be stored in an external device not shown to thereby input from this external device.

The limit control unit 10AB includes a calculation section 10Ab-c for calculating a difference between an output voltage feedback value Vpp-FB and an output voltage limit value 10c(Vpp-limit), a calculation section 10Ab-d for calculating a difference between the forward power feedback value FWD-FB and the forward power limit value 10d, and calculation sections 10Ab-e to 10Ab-h for outputting output command values based on comparison between feedback values of respective outputs and limit values.

The calculation section 10Ab-c is configured to compare the output voltage feedback value Vpp-FB with the output voltage limit value 10c(Vpp-limit), and when the output voltage feedback value Vpp-FB is below the output voltage limit value 10c(Vpp-limit), output directly an output voltage command value Vpp-CO, and when the output voltage feedback value Vpp-FB exceeds the output voltage limit value 10c(Vpp-limit), replace the output voltage command value Vpp-CO with the output voltage limit value 10c(Vpp-limit) to output it as output voltage command value Vpp-CO.

The calculation section 10Ab-d is configured to calculate the difference between the forward power feedback value FWD-FB and the forward power limit value 10d, and the frequency control section 10Ba performs the frequency control based on the difference thus obtained.

The calculation sections 10Ab-e to 10Ab-h are configured to directly output the output command values when the feedback values of the outputs are below the respective limit values, and when the feedback values of the outputs exceed the respective limit values, replace the output command values with the respective limit values to thereby output them as the output command values.

The calculation section 10Ab-d is configured to compare the forward power feedback value FWD-FB with the forward power limit value 10d(FWD-limit), and when the forward power feedback value FWD-FB is below the forward power limit value 10d(FWD-limit), output directly a forward power command value FWD-CO, and when the forward power feedback value FWD-FB exceeds the forward power limit value 10d(FWD-limit), output the forward power limit value 10d(FWD-limit) instead of the forward power command value FWD-CO.

The calculation section 10Ab-e is configured to compare the reflected power feedback value REF-FB with the reflected power limit value 10e(REF-limit), and when the reflected power feedback value REF-FB is below the reflected power limit value 10e(REF-limit), output directly a reflected power command value REF-CO, and when the reflected power feedback value REF-FB exceeds the reflected power limit value 10e(REF-limit), replace the forward power command value REF-CO with the reflected power limit value 10e(ERF-limit) to output it as the reflected power command value REF-CO.

The calculation section 10Ab-f is configured to compare a DC power source voltage feedback value Vdc-FB with a direct-current (DC) voltage limit value 10f(Vdc-limit), and when the direct-current (DC) voltage feedback value Vdc-FB is below the current-direct (DC) voltage limit value 10f(Vdc-limit), output directly a direct-current (DC) voltage command value Vdc-CO, and when the direct-current (DC) voltage feedback value Vdc-FB exceeds the current-direct (DC) voltage limit value 10f(Vdc-limit), replace the DC voltage command value Vdc-CO with the DC voltage limit value 10f(Vdc-limit) to output it as the DC voltage command value Vdc-CO.

The calculation section 10Ab-g is configured to compare a DC power source current feedback value Idc-FB with a direct current limit value 10g(Idc-limit), and when the DC power source current feedback value Idc-FB is below the direct current limit value 10g(Idc-limit), output directly a DC current command value Idc–CO, and when the DC power source current feedback value Idc–FB exceeds the direct current limit value 10g(Idc–limit), replace the DC current command value Idc–CO with the DC current limit value 10g(Idc–limit) to output it as the DC current command value Idc–CO.

The calculation section 10Ab-h is configured to compare a loss power feedback value Loss–FB with a loss power limit value 10h(Loss–limit), and when the loss power feedback value Loss–FB is below the loss power limit value 10h(Loss–limit), output directly a loss power command value Loss–CO, and when the loss power feedback value Loss–FB exceeds the loss power limit value 10h(Loss–limit), replace the loss power command value Loss–CO with the loss power limit value 10h(Loss–limit) to output it as the loss power command value Loss–CO.

The loss power limit value Loss–limit corresponding to the loss power feedback signal Loss–FB is a limit value that corresponds to loss power caused in the power supply from the high-frequency power supply device to the load. The loss power is a loss caused in the power supply by the high-frequency power supply device, and is equivalent to power obtained by subtracting effective power from supplied power, that is, the loss power can be calculated by subtracting the forward power and the reflected power from an amount of power supplied by the high-frequency power supply device. A calculation section 10Ab-2 calculates a feedback value Pdc–FB of DC power source power from a product of a feedback value of DC power source voltage Vdc–FB and a feedback value of DC power source current Idc–FB. A calculation section 10Ab-3 calculates loss power Loss by subtracting the forward power feedback value FWD–FB from the feedback value of DC power source power Pdc–FB and then adding the reflected power feedback value REF–FB.

The controller 10 uses an output limit value having upper limit defined by the limit control unit 10AB to well control the damage to the circuit elements of the high-frequency amplifier 3 caused by an excessive output command value output to the high-frequency amplifier 3.

The drive control unit 10C includes a hold circuit 10Ca for holding a control value obtained in last control period, a control value error amplifying circuit 10Cb for obtaining a difference between the control value in the last control period held in the hold circuit 10Ca and a control value in the current control period to amplify an error, and a drive circuit 10Cc for generating a drive signal for driving the high-frequency amplifier 3 based on a signal subjected to signal amplification by the control value error amplifying circuit 10Cb. The drive control unit 10C uses the control frequency obtained by the frequency control unit 10Ba (FIG. 4) and the output command value having its upper limit defined by the limit control unit 10AB as a control value to thereby control the amplification in the high-frequency amplifier 3.

<Example of Forward Power Limit>

Some examples of the output limit value will now be described by referring to FIGS. 20 to 22. The output limit value is set in a frequency range that includes a reference frequency, and frequency characteristics can be defined to be symmetric or asymmetric with respect to the reference frequency in the frequency range.

Figure 20:
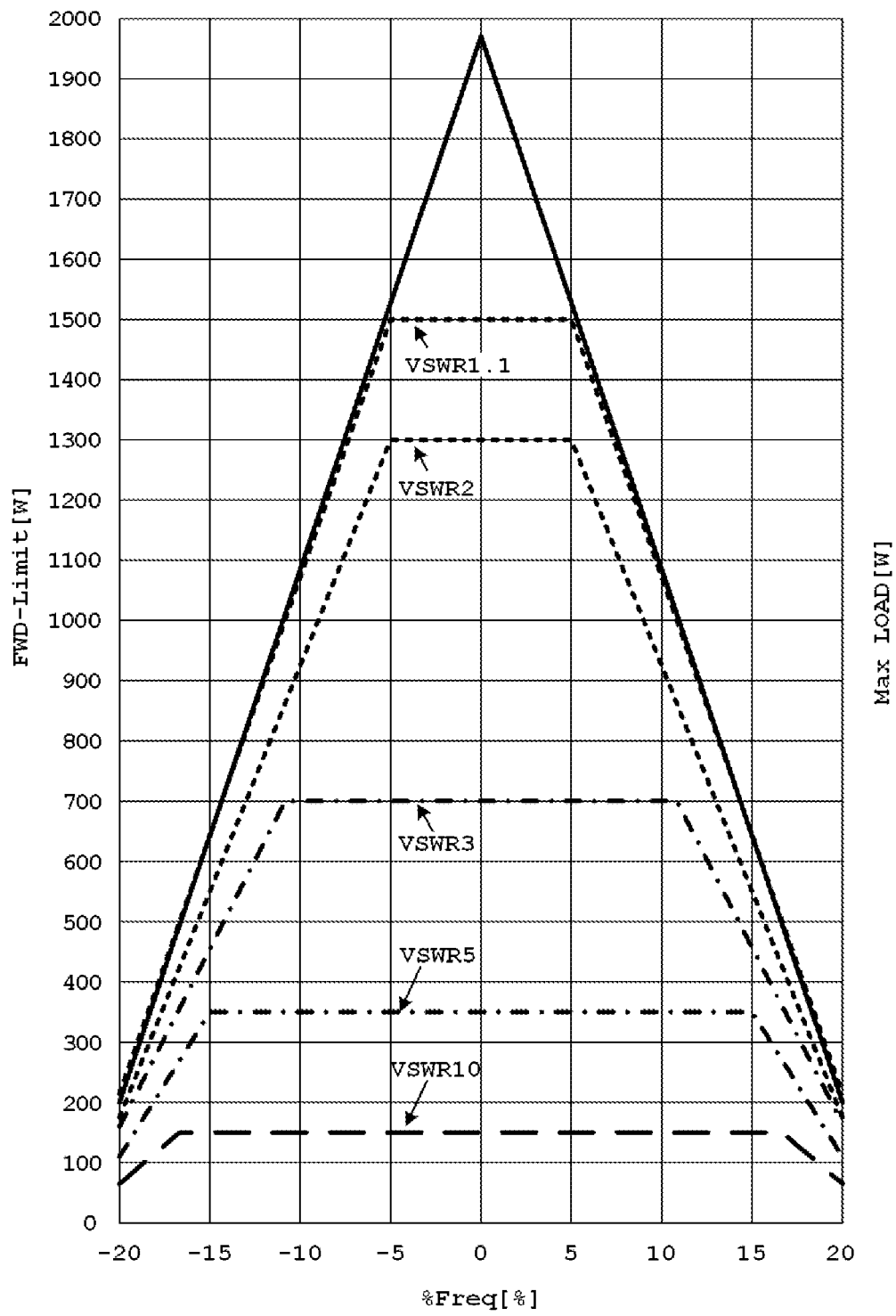
FIG. 20 illustrates an example of frequency characteristics of a FWD limit value.

FIG. 20 shows an example of the output limit value. In this figure, the frequency range is set to [−20% to +20%]. The frequency characteristics of the output limit value are dependent on a voltage standing wave ratio (VSWR). A reflectivity coefficient "0" corresponds to a voltage standing wave ratio "1", wherein the frequency characteristics of the output limit value when the ratio is 1 is denoted with a thick solid line in the figure, and at a frequency of 0%, the limit value linearly decreases toward the end of the frequency range with the forward power limit value FWD–Limit as a peak.

The frequency characteristics of the output limit value denoted with a broken line and a dashed-dotted line in the figure show examples when the voltage standing wave ratios are 1.1, 2, 3, 5 and 10, in which the larger the voltage standing wave ratio (VSWR), the smaller the output limit value, and thereby the influence of the reflected power is reduced. Furthermore, a unit % Freq shown on a horizontal axis expresses a degree of the deviation from the reference frequency as %, as with the cases shown in FIGS. 13, 16 and 17.

(Example of Symmetric Frequency Characteristics)

If the frequency characteristics of the output command value on a high frequency part and a low frequency part are considered to be equivalent with respect to the reference frequency, the frequency characteristics can be set to be symmetric with the reference frequency in the frequency range.

FIG. 21 shows examples of the symmetric frequency characteristics, in which each example has a frequency range with the same frequency width on a high frequency part and a low frequency part centered on a reference frequency ωo, and also has symmetric frequency characteristics.

The example in FIG. 21(a) shows that, in the frequency range, there is a range having a certain output limit value on both sides of the reference frequency ωo, and the output limit value decreases with a predetermined slope toward a frequency end ω– and a frequency end ω+. The output limit value in the vicinity of the reference frequency ωo can be defined based on a rated output. For example, a value obtained by adding a predetermined margin to a rated value of the high-frequency power supply device can be applied. The margin can be set arbitrary according to the usage conditions of the high-frequency power supply device, such as a value endurable to excessive power supply for a short period of time.

The example in FIG. 21(b) shows that the output limit value decreases with a predetermined slope from the center of the reference frequency ωo toward a frequency end co– and a frequency end ω+. The output limit value at the reference frequency ωo can be defined based on the rated output. For example, a value obtained by adding a predetermined margin to the rated value of the high-frequency power supply device can be applied. The margin in the example of FIG. 21(b) can be set to be greater than the margin in the example of FIG. 21(a). The frequency characteristics in FIG. 19 shows the examples of FIGS. 21(a) and 21(b).

The examples in FIGS. 21(c), 21(d) and 21(e) show that, in the frequency range, there is a range having a certain output limit value on both sides of the reference frequency φo, and the output limit value decreases with a predetermined curve toward a frequency end ω– and a frequency end ω+.

The output limit value in the vicinity of the reference frequency ωo can be defined based on the rated output, as with the example in FIG. 21(a). The curve of decrease can be decrease characteristics corresponding to the open loop characteristics of the high-frequency amplifier, by way of example. The examples of FIGS. 21(c) and 21(d) show that the output limit value decreases with a concave curve toward the frequency ends, in which the decrease rate of the output limit value on the part of the reference frequency ωo is large, whereas the decrease rates on the frequency end ω− and the frequency end ω+ are small. The example of FIG. 21(c) shows gentle decrease characteristics, and FIG. 21(d) shows steep decrease characteristics.

The Example in FIG. 21(e) shows that the output limit value decreases with a convex curve toward the ends of the frequency.

The Example in FIG. 21(f) has a frequency range with the same frequency width on a high frequency part and a low frequency part centered on a reference frequency ωo, and includes a predetermined output limit value in this frequency range.

(Example of Asymmetric Frequency Characteristics)

There may be a difference between frequency characteristics of an output command value of a control frequency higher than a reference frequency and frequency characteristics of an output command value of a control frequency lower than the reference frequency. When the frequency characteristics of the output command value is asymmetric with respect to the reference frequency, the frequency characteristics of the output limit value is set to be asymmetric with respect to a reference frequency in a frequency range.

For example, the open loop characteristics of the high-frequency amplifier has substantial influence on the frequency characteristics, and when the control frequency has different frequency characteristics on the high frequency part and the low frequency part with respect to the reference frequency, the frequency characteristics according to the open loop characteristics are set to be asymmetric with respect to the reference frequency in the frequency range.

In FIG. 22, FIGS. 22(a) to 22(d) show examples of the open loop characteristics of the high-frequency amplifier and an output limit value corresponding to the open loop characteristics.

In the open loop characteristics of the high-frequency amplifier in FIG. 22(a), forward power linearly decreases from a cutoff frequency toward a high frequency part. The output limit value in FIG. 22(a) is a constant value on the low frequency part from a reference frequency ωo, and decreases at a constant slope toward a frequency end ω+ on the high frequency part from the reference frequency ωo.

In the open loop characteristics of the high-frequency amplifier in FIGS. 22(b) and 22(c), the forward power decreases with a concave curve from the cutoff frequency toward the high frequency part. The output limit values in FIGS. 22(b) and 22(c) are constant values on the low frequency part from the reference frequency ωo, and decrease with a concave curve toward the frequency end ω+ on the high frequency part from the reference frequency ωo. The example of FIG. 21(b) shows gentle decrease characteristics, and FIG. 21(c) shows steep decrease characteristics.

In the open loop characteristics of the high-frequency amplifier in FIG. 22(d), the forward power decreases with a convex curve from the cutoff frequency toward the high frequency part. The output limit value in FIG. 22(d) is a constant value on the low frequency part from the reference frequency ωo, and decreases with a convex curve toward the frequency end ω+ on the high frequency part from the reference frequency ωo.

The above embodiments and modifications are a few examples of the high-frequency power source of the present invention, and thus the present invention is not limited thereto. Accordingly, the present invention can be modified in various ways based on the gist of the invention, which modifications are not excluded from the scope of the present invention.

INDUSTRIAL APPLICABILITY

The high-frequency power supply device of the present invention can be applied as power source for supplying electric power to a plasma generation device, and also as a power supply device that supplies a pulse output to, for instance, a load for exciting a pulse laser, or of an electric discharge machine.

REFERENCE SIGNS LIST

1 High-Frequency Power Supply Device
2 DC Power Source
3 High-Frequency Amplifier
4 High-Frequency Sensor
5 Matching Unit
6 Load
7 Transformer
8 High-Frequency Filter
10 Controller
10A Output Control Unit
10B Impedance Matching Control Unit
10C Drive Control Unit
10AA Output Control Unit
10AB Limit Control Unit
10Aa Output Control Section
10Ab Output Limit Value Control Section
10Ba Frequency Control Section
10Bb Frequency Limit Value Control Section
10Ca Hold Circuit
10Cb Control Value Error Amplifying Circuit
10Cc Drive Circuit
10Ab-c to 10Ab-h Calculation Section
10Ab-2, 10Ab-3 Calculation Section
10a Forward Power Command Value
10b Load Power Command Value
10c Output (Vpp) Voltage Limit Value
10d Forward Power Limit Value
10e Reflected Power Limit Value
10f DC Voltage Limit Value
10g Direct Current Limit Value
10h Loss Power Limit Value
FWD Forward Power
FWD−CO Forward Power Command Value
FWD−BF Forward Power Feedback Value
FWD−limit Forward Power Limit Value
FWDmonitor Forward Power Monitor Value
Idc−CO Direct Current Command Value
Idc−FB Direct Current Feedback Value
Loss−limit Loss Power Limit Value
Loss−CO Load Power Command Value
Loss Loss Power
Pcommand1 Output Command Value
Pcommand2 Output Command Value
Pdc−FB Feedback Value of DC Power Source Power
Plimit Upper Limit Value
Pout Output
REF Reflected Power
REF−CO Reflected Power Command Value
REF−BF Reflected Power Feedback Value
REFmonitor Reflected Power Monitor Value
Vdc−CO DC Voltage Command Value
Vdc−FB DC Voltage Feedback Value Vpp Output Voltage
Vpp-CO Output Voltage Command Value
Vpp-FB Output Voltage Feedback Value
Γ Reflectivity Coefficient
Δ Difference
Δhigh Predetermined Frequency Width
Δlow Predetermined Frequency Width
ΔFWD Difference
ΔFWDset Threshold Value
ΔREF Difference
ΔREFset Threshold Value
ω Control Frequency
ω0 Reference Frequency

The invention claimed is:

1. A method for controlling a high-frequency power supply device which supplies high frequency power to a load, comprising:
output control for controlling an output from a high-frequency amplifier, which outputs high frequency power by DC-AC conversion, based on an output command; and
impedance matching control for matching impedances of the high-frequency amplifier and the load, wherein
the impedance matching control comprises:
(A) frequency control for changing a control frequency based on a feedback signal of the high-frequency amplifier to match the impedances; and
(B) frequency limit value control for setting a frequency limit value for defining a frequency range of the frequency control,
(C) the frequency control controlling a frequency of the high-frequency amplifier in the frequency range of the frequency limit value set by the frequency limit value control,
wherein the output control can freely change a command value of the output command in a plurality of stages during successive control processes.

2. A method for controlling a high-frequency power supply device which supplies high frequency power to a load, comprising:
output control for controlling an output from a high-frequency amplifier, which outputs high frequency power by DC-AC conversion, based on an output command; and
impedance matching control for matching impedances of the high-frequency amplifier and the load, wherein
the impedance matching control comprises:
(A) frequency control for changing a control frequency based on a feedback signal of the high-frequency amplifier to match the impedances; and
(B) frequency limit value control for setting a frequency limit value for defining a frequency range of the frequency control,
(C) the frequency control controlling a frequency of the high-frequency amplifier in the frequency range of the frequency limit value set by the frequency limit value control, wherein the output control comprises:
(D) output limit value control for setting an output limit value for limiting an output in the frequency range, in which
(E) an output of the high-frequency amplifier is controlled by an output command value in which the output limit value set by the output limit value control is defined as an upper limit,
(F) the output control and the impedance matching control being performed separately.

3. The method for controlling the high-frequency power supply device according to claim 1, wherein the output command is effective load power (LOAD power) to be supplied to the load, or forward power to be supplied from the high-frequency power supply device to the load.

4. The method for controlling the high-frequency power supply device according to claim 2, wherein when the output command value of the high-frequency amplifier exceeds the output limit value, the output limit value control replaces the output command value with the output limit value to limit the output command value.

5. The method for controlling the high-frequency power supply device according to claim 2, wherein the feedback signal is of at least one of forward power, reflected power, an output voltage, a DC voltage and a direct current of the high-frequency amplifier, and
the output limit value is a forward power limit value, a reflected power limit value, an output voltage limit value, a DC voltage limit value, a direct current limit value and/or a loss power limit value, which are set in response to the respective feedback signals,
in each control frequency, when the output command value exceeds the output command limit value, the output command value is limited to the output limit value, so as to control the output of the high-frequency amplifier by the limited output command value.

6. The method for controlling the high-frequency power supply device according to claim 2, wherein the output limit value has frequency characteristics that are symmetric with respect to a reference frequency in the frequency range.

7. The method for controlling the high-frequency power supply device according to claim 2, wherein the output limit value has frequency characteristics that are asymmetric with respect to a reference frequency in the frequency range, in which the asymmetry of the frequency characteristics corresponds to frequency characteristics of amplification of the high-frequency amplifier and frequency characteristics of a load impedance.

8. A high-frequency power supply device for supplying high frequency power to a load, comprising:
a high-frequency amplifier that outputs the high frequency power;
an output control unit that performs output control on an output of the high-frequency amplifier; and
an impedance matching control unit that matches impedances of the high-frequency amplifier and the load, wherein
the impedance matching control unit comprises:
(a) a frequency control section that changes a control frequency by frequency control based on a feedback signal of the high-frequency amplifier; and
(b) a frequency limit value control section that sets a frequency limit value for defining a frequency range in the frequency control, wherein
the frequency control section is for
(c) controlling a frequency of the high-frequency amplifier in the frequency range of the frequency limit value set by the frequency limit value control section,
wherein the output control can freely change a command value of the output command in a plurality of stages during successive control processes.

9. A high-frequency power supply device for supplying high frequency power to a load, comprising:
a high-frequency amplifier that outputs the high frequency power;
an output control unit that performs output control on an output of the high-frequency amplifier; and an impedance matching control unit that matches impedances of the high-frequency amplifier and the load, wherein the impedance matching control unit comprises:

(a) a frequency control section that changes a control frequency by frequency control based on a feedback signal of the high-frequency amplifier; and (b) a frequency limit value control section that sets a frequency limit value for defining a frequency range in the frequency control, wherein the frequency control section is for (c) controlling a frequency of the high-frequency amplifier in the frequency range of the frequency limit value set by the frequency limit value control section, wherein the output control unit comprises (d) an output limit value control that sets an output limit value for limiting an output control value of the output control unit in the frequency range, in which (e) an output of the high-frequency amplifier is controlled by an output command value in which the output limit value set by the output limit value control is defined as an upper limit, the output control unit and the impedance matching control unit performing (f) the control separately.

* * * * *